(12) United States Patent
Ko et al.

(10) Patent No.: US 10,804,212 B2
(45) Date of Patent: Oct. 13, 2020

(54) SEMICONDUCTOR DEVICE AND PACKAGE INCLUDING MODIFIED REGION OF LESS DENSITY AT EDGE OF DEVICE OR SUBSTRATE

(71) Applicant: SAMSUNG ELECTRONICS CO., LTD., Suwon-si, Gyeonggi-do (KR)

(72) Inventors: Yeong-Kwon Ko, Suwon-si (KR); Jun-Yeong Heo, Suwon-si (KR); Un-Byoung Kang, Hwaseong-si (KR); Ja-Yeon Lee, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/280,186

(22) Filed: Feb. 20, 2019

(65) Prior Publication Data
US 2020/0020641 A1    Jan. 16, 2020

(30) Foreign Application Priority Data

Jul. 16, 2018 (KR) .................. 10-2018-0082374

(51) Int. Cl.
| | |
|---|---|
| *H01L 25/04* | (2014.01) |
| *H01L 23/544* | (2006.01) |
| *H01L 23/00* | (2006.01) |
| *H01L 23/31* | (2006.01) |
| *H01L 25/065* | (2006.01) |

(Continued)

(52) U.S. Cl.
CPC .......... *H01L 23/544* (2013.01); *H01L 21/78* (2013.01); *H01L 23/3107* (2013.01); *H01L 24/73* (2013.01); *H01L 24/94* (2013.01); *H01L 24/97* (2013.01); *H01L 25/0657* (2013.01); *H01L 25/18* (2013.01); *H01L 24/05* (2013.01); *H01L 24/06* (2013.01); *H01L 2223/5446* (2013.01); *H01L 2223/54426* (2013.01); *H01L 2224/0557* (2013.01); *H01L 2224/06181* (2013.01); *H01L 2224/73204* (2013.01); *H01L 2225/06513* (2013.01); *H01L 2225/06517* (2013.01); *H01L 2225/06541* (2013.01); *H01L 2225/06555* (2013.01); *H01L 2225/06586* (2013.01)

(58) Field of Classification Search
CPC .............. H01L 25/043; H01L 25/0657; H01L 25/0756; H01L 25/117; H01L 23/544
See application file for complete search history.

(56) References Cited

U.S. PATENT DOCUMENTS

| | | |
|---|---|---|
| 7,115,483 B2 | 10/2006 | Kwon et al. |
| 7,250,354 B2 | 7/2007 | Uchida |
| 7,504,722 B2 | 3/2009 | Ochiai |

(Continued)

*Primary Examiner* — Haoi V Pham
(74) *Attorney, Agent, or Firm* — Volentine, Whitt & Francos, PLLC

(57) ABSTRACT

A semiconductor package includes a package substrate, a first semiconductor device on an upper surface of the package substrate, a second semiconductor device on an upper surface of the first semiconductor device, a first connection bump attached to a lower surface of the package substrate, a second connection bump interposed between and electrically connected to the package substrate and the first semiconductor device, and a third connection bump interposed between and electrically connected to the first semiconductor device and the second semiconductor device. The first semiconductor device has an edge and a step at the edge.

16 Claims, 22 Drawing Sheets

(51) Int. Cl.
    *H01L 25/18* (2006.01)
    *H01L 21/78* (2006.01)

(56) References Cited

U.S. PATENT DOCUMENTS

| | | |
|---|---|---|
| 7,674,689 B2 | 3/2010 | Schneegans et al. |
| 8,048,781 B2 | 11/2011 | How |
| 8,071,429 B1 | 12/2011 | Qian et al. |
| 8,629,532 B2 | 1/2014 | Chen et al. |
| 8,912,078 B1 | 12/2014 | Lei et al. |
| 9,343,366 B2 | 5/2016 | Lei et al. |
| 9,412,662 B2 | 8/2016 | Lin et al. |
| 2011/0163458 A1* | 7/2011 | Tsukano .............. H01L 23/3135 257/777 |
| 2013/0344658 A1* | 12/2013 | Sakurada ................ H01L 21/78 438/113 |
| 2017/0062277 A1 | 3/2017 | Schrems et al. |
| 2018/0166420 A1* | 6/2018 | Park ........................ H01L 23/46 |

* cited by examiner

SEMICONDUCTOR DEVICE AND PACKAGE INCLUDING MODIFIED REGION OF LESS DENSITY AT EDGE OF DEVICE OR SUBSTRATE

PRIORITY STATEMENT

This application claims the benefit of Korean Patent Application No. 10-2018-0082374, filed on Jul. 16, 2018, in the Korean Intellectual Property Office, the disclosure of which is hereby incorporated by reference in its entirety.

BACKGROUND

The inventive concept relates to a semiconductor device and to a semiconductor package including the same, as well as to an article that can be diced into semiconductor devices for use in a semiconductor package. The inventive concept also relates to a dicing method of forming semiconductor devices and to a method of fabricating semiconductor packages by dicing a substrate into individual semiconductor devices and then forming a package from at least one of the semiconductor devices.

In a process of dicing a semiconductor substrate, the semiconductor substrate is fixed to a tape, and then the semiconductor substrate and the tape are diced. In this case, the tape may elongate and deform due to its ductility (a tape burr phenomenon) without being cleanly diced, and the diced surface of the semiconductor substrate may chip. These problems may lead to contamination of the semiconductor substrate and reduction in a production yield of semiconductor devices from the semiconductor substrate.

SUMMARY

According to an aspect of the inventive concept, there is provided a semiconductor package including: a package substrate, a first semiconductor device on an upper surface of the package substrate, a second semiconductor device on an upper surface of the first semiconductor device, a first connection bump attached to a lower surface of the package substrate, a second connection bump interposed between and electrically connected to the package substrate and the first semiconductor device, and a third connection bump interposed between and electrically connected to the first semiconductor device and the second semiconductor device, and in which a step in the first semiconductor device is defined at an edge of the first semiconductor device.

According to another aspect of the inventive concept, there is provided an article of manufacture for use in fabricating semiconductor devices, including: a semiconductor substrate, and a semiconductor device layer at an upper portion of the semiconductor substrate. The semiconductor device layer comprises dies on a first region of the semiconductor substrate, and the dies are separated by a scribe lane on a second region of the semiconductor substrate. Also, the semiconductor substrate has a modified region within the second region thereof, and a trench in a lower part of the second region.

According to another aspect of the inventive concept, there is provided a semiconductor device including: a semiconductor substrate having opposite sides, a semiconductor device layer at one of the sides of the semiconductor substrate and constituting a first surface of the semiconductor device, and an electrical pattern layer on the other of the sides of semiconductor substrate and constituting a second surface of the semiconductor device, and in which the semiconductor substrate has a step therein constituting an edge of the semiconductor device, and the semiconductor substrate has a modified region constituting the edge of the semiconductor device.

According to another aspect of the inventive concept, there is provided a semiconductor package, including: a stack of vertically spaced apart components including a lower substrate, an upper semiconductor device and at least one intermediate semiconductor device interposed between the lower substrate and the upper semiconductor device, underfill material interposed between the components and protruding laterally outwardly of a combined footprint of the semiconductor devices, and a molded layer encapsulating each said at least one intermediate semiconductor device and the underfill material on the lower substrate. Each intermediate semiconductor device includes a semiconductor substrate. The semiconductor substrate has a step therein constituting an edge of the intermediate semiconductor device, and a modified region constituting the edge. The underfill material fills in the step.

BRIEF DESCRIPTION OF THE DRAWINGS

The inventive concept will be more clearly understood from the following detailed description taken in conjunction with the accompanying drawings in which:

FIGS. 7, 8, 9, 10, 11, 12, 13, 14A, 14B, 15, 16, 17 and 18 are cross-sectional views, respectively, of structures during the course of a method of manufacturing a semiconductor package according to the inventive concept, wherein FIGS. 14A and 14B illustrate different examples of a dicing operation that may be carried out in the method.

DETAILED DESCRIPTION

Examples of the inventive concept will be described in detail with reference to the accompanying drawings.

Figure 1:
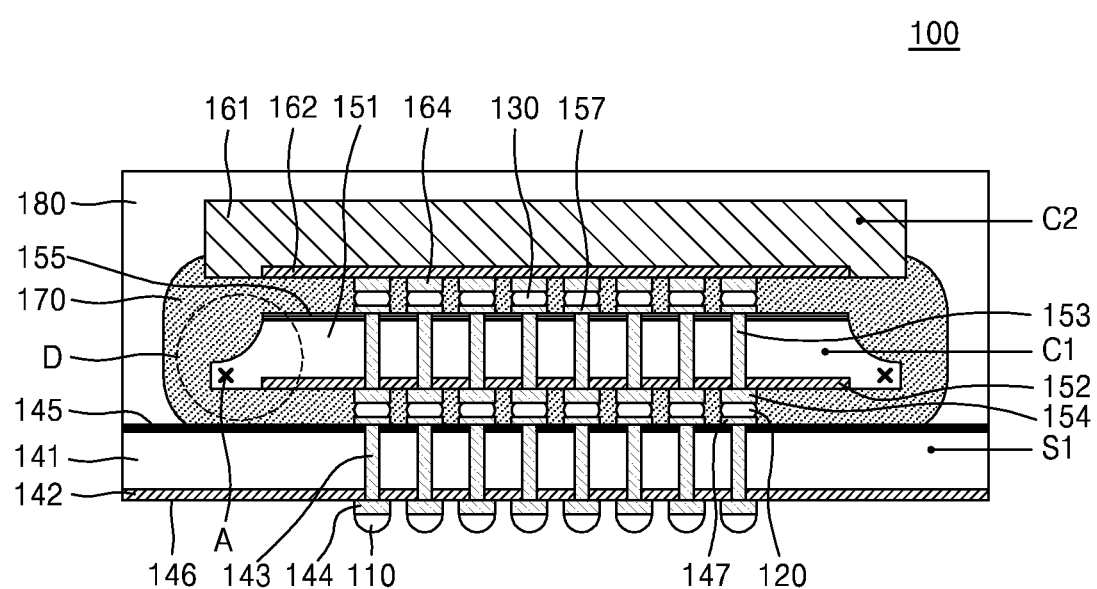
FIG. 1 is a cross-sectional view of a semiconductor package according to an example of the inventive concept.

FIG. 1 is a cross-sectional view of a semiconductor package 100 according to an example of the inventive concept.

Referring to FIG. 1, the semiconductor package 100 may include a package substrate S1. The package substrate S1 may include any one of a wafer, a carrier, a printed circuit board (PCB), and a semiconductor device. In addition, the semiconductor package 100 may further include a first semiconductor device C1 and a second semiconductor device C2 on the package substrate S1.

The first and second semiconductor devices C1 and C2 may be a semiconductor memory device. The semiconductor memory devices may be volatile memory semiconductor devices, e.g., a dynamic random access memory (DRAM) or static random access memory (SRAM) devices, or a non-volatile memory semiconductor devices, e.g., phase-change random access memory (PRAM), magneto-resistive random access memory (MRAM), ferroelectric random access memory (FeRAM), or resistive random access memory (RRAM) devices.

Alternatively, the first and second semiconductor devices C1 and C2 may be logic semiconductor devices. For example, the first and second semiconductor devices C1 and C2 may be central processing units (CPUs), graphics processing units (GPUs), or application processors (APs).

The first and second semiconductor devices C1 and C2 may be homogeneous or heterogeneous semiconductor devices. Although FIG. 1 shows, as an example, the semiconductor package 100 having the first and second semiconductor devices C1 and C2 stacked therein, the number of semiconductor devices stacked inside the semiconductor package 100 is not limited thereto. For example, 2 to 32 semiconductor devices may be stacked inside the semiconductor package 100.

Still referring to FIG. 1, a first connection bump 110 may be located under a lower surface of the package substrate S1. The first semiconductor device C1 may be mounted on an upper surface of the package substrate S1, and a second connection bump 120 may be arranged between the package substrate S1 and the first semiconductor device C1 such that the first semiconductor device C1 may be electrically connected to the package substrate S1. The second semiconductor device C2 may be mounted on an upper surface of the first semiconductor device C1 and electrically connected to the first semiconductor device C1 via a third connection bump 130.

The first connection bump 110 may have a structure different from those of the second connection bump 120 and the third connection bump 130. According to some examples, the second connection bump 120 and the third connection bump 130 have the same structure.

The package substrate S1 may include a third semiconductor device. The package substrate S1 may include a first semiconductor substrate 141, a first semiconductor device layer 142, a first through electrode 143, and a first connection pad 144. As shown in FIG. 1, the first semiconductor substrate 141 may include an upper surface 145 and a lower surface 146 which are arranged at opposite locations, and the first semiconductor device layer 142 may be formed under the lower surface 146 of the first semiconductor substrate 141. The first through electrode 143 extends through the first semiconductor substrate 141. The first connection pad 144 may be formed under the lower surface 146 of the first semiconductor substrate 141 and may be electrically connected to the first through electrode 143.

In the above description, for convenience, the upper surface 145 refers to a surface of the first semiconductor substrate 141 which is arranged close to the first semiconductor device C1, and the lower surface 146 refers to a surface of the first semiconductor substrate 141 which is arranged close to the first connection bump 110. However, in a case in which the semiconductor package 100 is turned upside-down the upper surface 145 of the first semiconductor substrate 141 is a bottom surface, and the lower surface 146 thereof is a top surface.

The first semiconductor substrate 141 of the package substrate S1 may be, for example, a silicon (Si) substrate. Alternatively, the first semiconductor substrate 141 may include a semiconductor element such as germanium (Ge) or a compound semiconductor such as silicon carbide (SiC), gallium arsenide (GaAs), indium arsenide (InAs), or indium phosphide (InP). Alternatively, the first semiconductor substrate 141 may have a silicon on insulator (SOI) structure. For example, the first semiconductor substrate 141 may include a buried oxide (BOX) layer. In addition, the first semiconductor substrate 141 may include a conductive region, e.g., an impurity-doped well or an impurity-doped structure. In addition, the first semiconductor substrate 141 may have any of various types of device separation structures such as a shallow trench isolation (STI) structure.

The first semiconductor device layer 142 of the package substrate S1 may include various types of individual devices. For example, the individual devices may include microelectronic devices, e.g., metal-oxide-semiconductor filed effect transistors (MOSFETs) such as a complementary metal-insulator-semiconductor (CMIS) transistor, image sensors such as a system large scale integration and a CMOS imaging sensor (CIS), micro-electro-mechanical systems (MEMS), active devices, passive devices, and the like. The individual devices may be formed inside the first semiconductor device layer 142 and electrically connected to the conductive region of the first semiconductor substrate 141. The first semiconductor device layer 142 may further include a conductive wiring or a conductive plug configured to electrically connect at least two of the individual devices or electrically connect a plurality of the individual devices to the conductive region of the first semiconductor substrate 141. In addition, each of the plurality of individual devices may be electrically isolated from neighboring others of the individual devices by insulating films.

Still referring to FIG. 1, the first through electrode 143 may extend from the upper surface 145 of the first semiconductor substrate 141 to the lower surface 146 thereof and into the first semiconductor device layer 142. At least a portion of the first through electrode 143 may have the shape of a pillar. Although not shown in FIG. 1, the first through electrode 143 may include a barrier film formed on a surface of the pillar and a buried conductive layer inside the barrier film.

The first connection pad 144 may be arranged on the first semiconductor device layer 142 and electrically connected to a wiring structure inside the first semiconductor device layer 142. The first connection pad 144 may be electrically connected to the first through electrode 143 through the electrical connection to the wiring structure. The first connection pad 144 may include at least one material selected from the group consisting of aluminum (Al), copper (Cu), nickel (Ni), tungsten (W), platinum (Pt), and gold (Au).

A first upper connection pad 147 electrically connected to the first through electrode 143 may be formed on the upper surface 145 of the first semiconductor substrate 141. The first upper connection pad 147 may include at least one material selected from the group consisting of Al, Cu, Ni, W, Pt, and Au.

The first connection bump 110 may be arranged under the first connection pad 144. The first connection bump 110 may be arranged under the lowest surface of the semiconductor package 100 and may be a chip-substrate connection bump serving to mount the semiconductor package 100 on an external substrate or an interposer. The first connection bump 110 may receive, from the outside, at least one of a control signal, a power signal, and a ground signal for operations of the first semiconductor device C1, the second semiconductor device C2, and the third semiconductor device or transmit, to the outside, data stored in the first semiconductor device C1, the second semiconductor device C2 and the third semiconductor device.

The first semiconductor device C1 may be mounted on the upper surface of the package substrate S1, and the second connection bump 120 may be interposed between the package substrate S1 and the first semiconductor device C1 such that the first semiconductor device C1 is electrically connected to the package substrate S1.

The first semiconductor device C1 may include a second semiconductor substrate 151, a second semiconductor device layer 152, a second through electrode 153, and a second connection pad 154. Although not shown in FIG. 1, an upper surface 155 of the first semiconductor device C1 may include an electrical patterning layer for an electrical connection to another semiconductor device. The electrical patterning layer may be electrically connected to the second semiconductor device layer 152 of the second semiconductor substrate 151 via the second through electrode 153 and electrically connected to the second semiconductor device C2 via a second upper connection pad 157 formed on the upper surface 155 of the first semiconductor device C1.

The first semiconductor device C1 may have similar technical features to those of the third semiconductor device included in the package substrate S1, and thus, a detailed description of the first semiconductor device C1 is omitted.

The second connection bump 120 may be interposed between the second connection pad 154 and the first upper connection pad 147 and may electrically connect the first semiconductor device C1 to the package substrate S1. Although not shown in FIG. 1, the second connection bump 120 may include a pillar structure and a solder layer.

The second semiconductor device C2 may be mounted on the upper surface of the first semiconductor device C1. The third connection bump 130 may be interposed between the first semiconductor device C1 and the second semiconductor device C2 such that the second semiconductor device C2 is electrically connected to the first semiconductor device C1.

The second semiconductor device C2 may include a third semiconductor substrate 161, a third semiconductor device layer 162, and a third connection pad 164. The second semiconductor device C2 may have similar technical features to those of the third semiconductor device included in the package substrate S1, and thus, a detailed description of the second semiconductor device C2 is omitted.

The third connection bump 130 may be interposed between the third connection pad 164 and the second upper connection pad 157 and may electrically connect the second semiconductor device C2 to the first semiconductor device C1. The third connection bump 130 may include a pillar structure and a solder layer. The third connection bump 130 may be an inter-chip connection bump interposed between semiconductor devices.

A connection film 170 may be interposed between the upper surface of the package substrate S1 and a lower surface of the first semiconductor device C1 and enclose side surfaces of second connection bumps 120. In addition, a connection film 170 may be interposed between the upper surface of the first semiconductor device C1 and a lower surface of the second semiconductor device C2 and enclose side surfaces of third connection bumps 130. According to an example of the inventive concept, the connection films 170 each protrude a certain amount widthwise outside a footprint of the first semiconductor device C1 and the second semiconductor device C2. The protruding portion of the connection film 170 interposed between the upper surface of the package substrate S1 and the lower surface of the first semiconductor device C1 and the protruding portion of the connection film 170 interposed between the upper surface of the first semiconductor device C1 and the lower surface of the second semiconductor device C2 may be connected to each other, i.e., integral with each other, as shown in FIG. 1. However, the inventive concept is not limited thereto, and the connection films 170 may be separate from each other, i.e., the protruding portions of the films 170 are not directly connected to each other. The connections films 170 whether they remain separate or are integral with each other may be referred to as underfill material.

Although not shown in FIG. 1, according to an example, the protruding portions of the connection films 170 are located on the same plane as a side surface of the semiconductor package 100. Therefore, when observing the outside of the semiconductor package 100, the connection films 170 may be viewed from the side of the semiconductor package 100.

Still referring to FIG. 1, a molding member 180 (or "molded layer") may encapsulate the various components on the package substrate S1 by encasing the upper surface of the package substrate S1 and the side surfaces of the first and second semiconductor devices C1 and C2. In more detail, the molding member 180 may envelop the side surfaces of the connection film 170 and the side surfaces of the first and second semiconductor devices C1 and C2. As shown in FIG. 1, a width of the package substrate S1 (dimension in a horizontal direction) may be greater than widths of the first and second semiconductor devices C1 and C2 in the horizontal direction, and the molding member 180 may contact an edge of the upper surface of the package substrate S1. In addition, the molding member 180 may be formed on an upper surface of the second semiconductor device C2. However, in another example not shown in FIG. 1, the molding member 180 may not extend over the upper surface of the second semiconductor device C2 and instead may expose the upper surface of the second semiconductor device C2 to the outside of the semiconductor package 100.

The molding member 180 may include an underfill material such as an insulating polymer or an epoxy resin. According to an example of the inventive concept, the molding member 180 is formed of an epoxy molding compound. The molding member 180 may cover the side surfaces of the connection film 170. In addition, the molding member 180 is not formed under the lower surface of the package substrate S1, and thus, the first connection bump 110 may be exposed to the outside.

The first semiconductor device C1 may include a step at its edge D. Here, according to its plain meaning, the term "edge" refers to the outer limit of the object; thus, in this case, the edge D refers to the outer peripheral side surface(s) of the first semiconductor device C1. The step formed at the edge D of the first semiconductor device C1 may be a remnant of a trench formed at a rear surface of a semiconductor substrate having a plurality of first semiconductor devices C1 formed thereon, as will be described below.

In addition, a modified region A may be formed in (a substrate of) the first semiconductor device C1 including along part of the edge D. Here, the term "modified region" refers to a region of material modified so as to have a different characteristic than its surrounding material. For example, due to the modified region A formed inside the edge D of the first semiconductor device C1, a density of the first semiconductor device C1 at the edge D may be less than a density at a central portion of the first semiconductor device C1. The modified region A inside the edge D of the first semiconductor device C1 will be described in more detail with reference to FIGS. 2A and 2B.

Figure 2A:
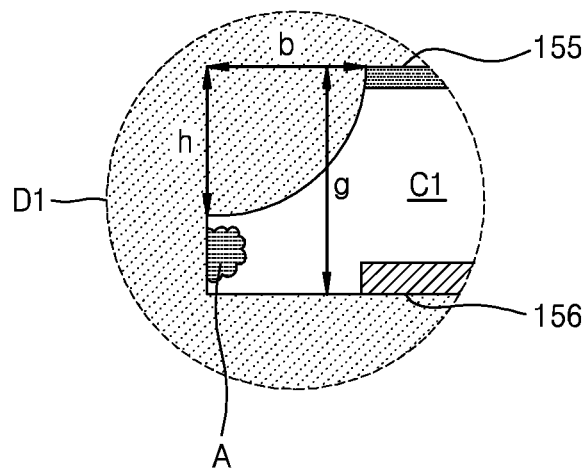
FIGS. 2A and 2B are each a cross-sectional view of the outer peripheral portion of a semiconductor device of a semiconductor package according to the inventive concept, each illustrating an example of a step at the edge of the device.
Figure 2B:
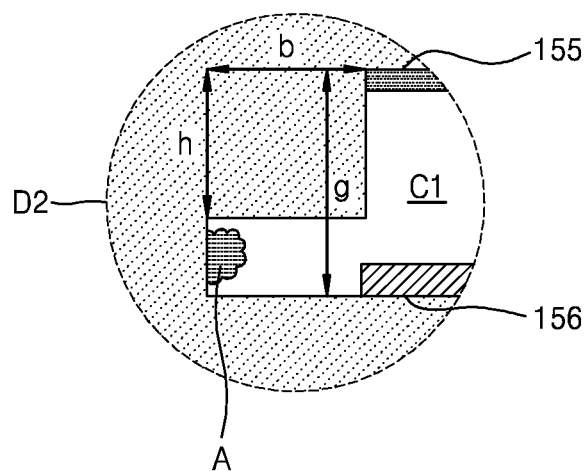

FIGS. 2A and 2B are cross-sectional views of examples of the edge D, namely edges D1 and D2, respectively, of the first semiconductor device C1 of the semiconductor package 100, according to the inventive concept.

Referring to FIGS. 2A and 2B, the modified region A formed in the edges D1 and D2 of the first semiconductor device C1 may be formed using a stealth laser device. The stealth laser device may use a lens to converge laser light of a wavelength, capable of passing through a semiconductor substrate, on a point inside the semiconductor substrate. As a result, very high nonlinear multiple photon absorption may occur near the light converging point. Due to the nonlinear multiple photon absorption, crystals in the semiconductor substrate may absorb energy of the light concentrated inside the semiconductor substrate to thereby form the modified region A by a hot-melting phenomenon.

The modified region A formed in the edges D1 and D2 of the first semiconductor device C1 may be used as an alignment key in a photolithography process of patterning an electrically conductive layer on a semiconductor substrate including first semiconductor devices C1, as will be described in more detail below. In addition, the modified region A is formed as an alignment key inside a scribe lane of a semiconductor substrate, a trench to be formed in the scribe lane of the semiconductor substrate may be formed deeper than if the modified region A were not formed. The greater a depth of the trench, the greater may be a height h of a step at the edges D1 and D2 of the first semiconductor device C1.

In the example shown in FIG. 2A, the step at the edge D1 of the first semiconductor device C1 is concave, i.e., is defined by inwardly curved surface. When individual first semiconductor devices C1 are separated by dicing a semiconductor substrate including the first semiconductor devices C1 and having an arch-shaped trench formed in a lower part of a scribe lane, the edge D1 of the first semiconductor device C1 may have a concave step as shown in FIG. 2A.

In the example shown in FIG. 2B, the step at the edge D2 of the first semiconductor device C1 may be defined by planar surfaces. When individual first semiconductor devices C1 are separated by dicing a semiconductor substrate including the first semiconductor devices C1 and having a quadrangular-shaped trench formed in a lower part of a scribe lane, the edge D2 of the first semiconductor device C1 may have a rectilinear step as shown in FIG. 2B.

However, the shape of the step at the edge D of the first semiconductor device C1 is not limited to those shown in FIGS. 2A and 2B.

Referring to FIGS. 2A and 2B, the height h of the step at the edges D1 and D2 of the first semiconductor device C1 may be around 30% to around 80% of a thickness g of the first semiconductor device C1. Preferably, the height h of the step at the edges D1 and D2 of the first semiconductor device C1 is around 50% to around 70% of the thickness g of the first semiconductor device C1. In certain examples of the inventive concept, the thickness g of the first semiconductor device C1 is about 50 μm, and the height h of the step is in a range from about 25 μm to about 35 μm. Here, the term "height of the step" refers to the thickness of the portion of the first semiconductor device C1 in which a recess delimited by the step is formed, whereas the thickness refers to the maximum thickness of the first semiconductor device C1, i.e., the thickness at a region which does not include the step, as shown in the drawings.

In addition, still referring to FIGS. 2A and 2B, an area of the upper surface 155 of the first semiconductor device C1 differs from an area of a lower surface 156 of the first semiconductor device C1. According to examples of the inventive concept, the area of the upper surface 155 of the first semiconductor device C1 is smaller than the area of the lower surface 156 of the first semiconductor device C1. A horizontal distance b measured from the top of the upper surface 155 to the bottom of the lower surface 156 may be about 30 μm to around 100 μm. In examples of the inventive concept, the horizontal distance b is in a range from about 50 μm to about 60 μm.

Figure 3A:
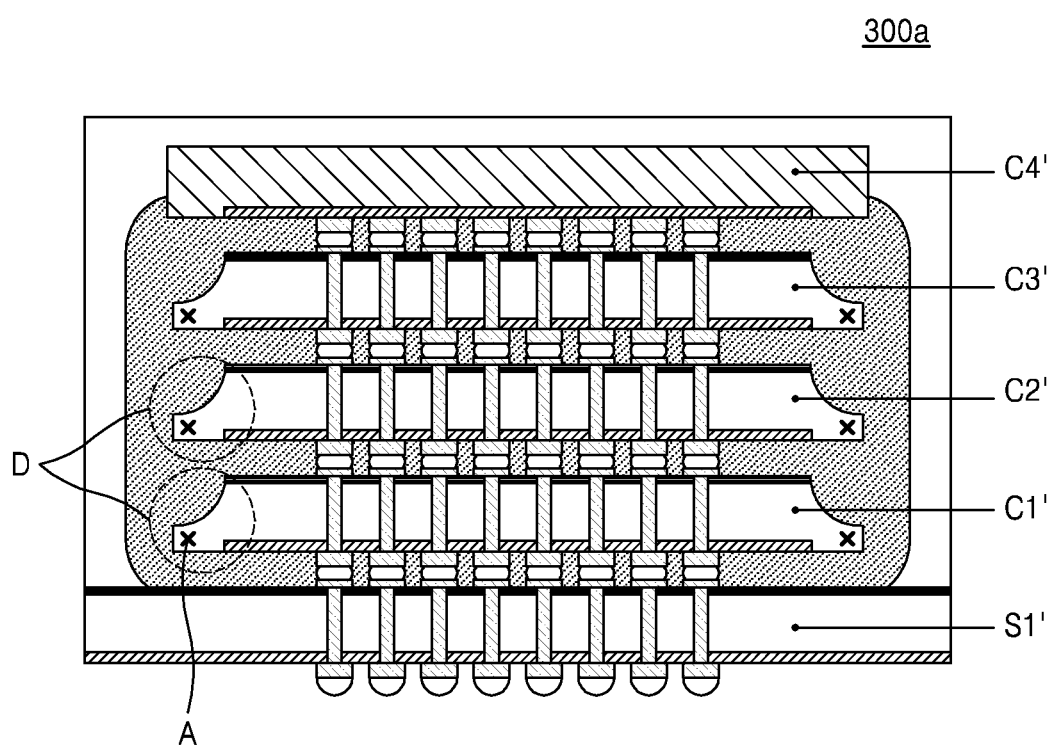
FIG. 3A is a cross-sectional view of a semiconductor package according to an example of the inventive concept.
Figure 3B:
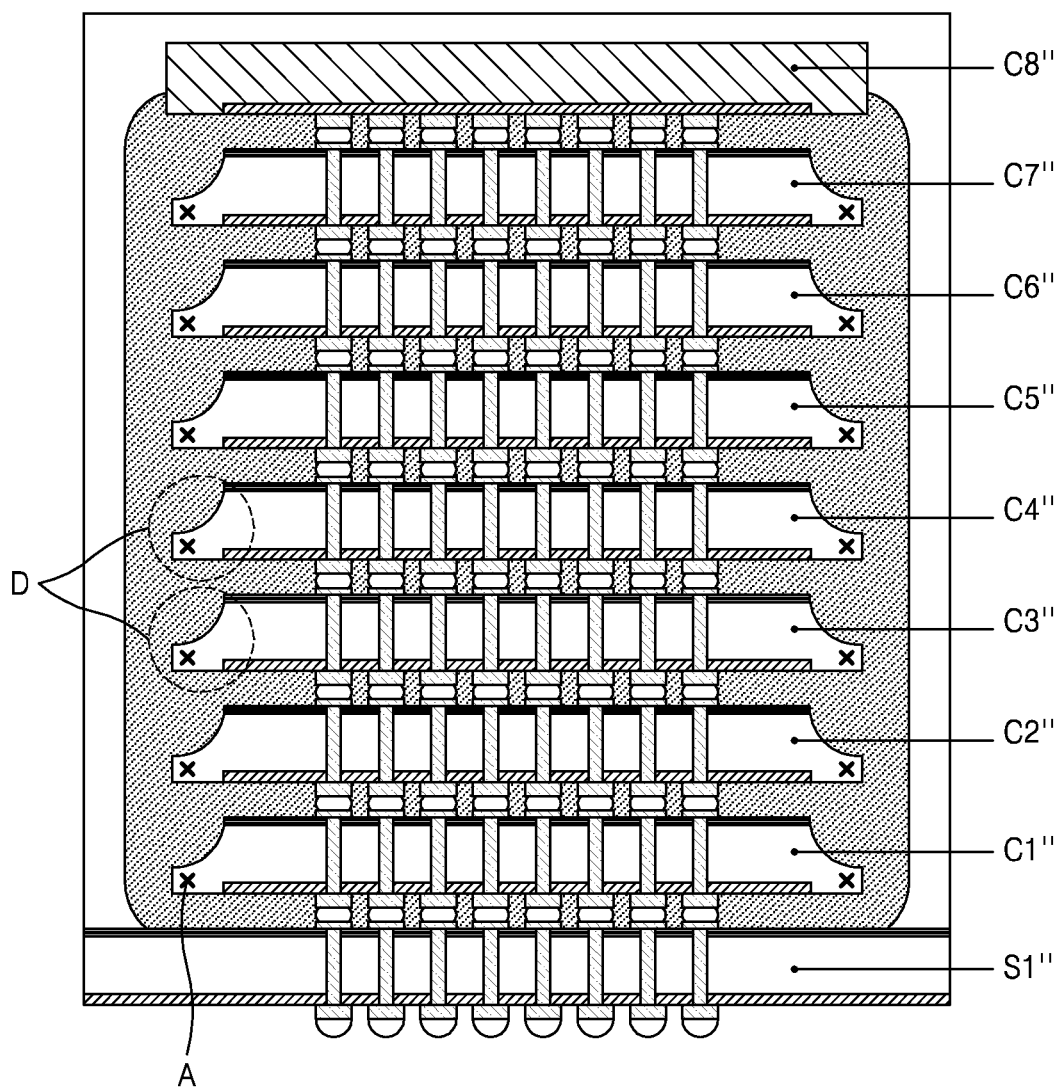
FIG. 3B is a cross-sectional view of a semiconductor package according to an example of the inventive concept.

FIGS. 3A and 3B are cross-sectional views of semiconductor packages 300a and 300b according to other examples of the inventive concept.

Referring to FIG. 3A, the semiconductor package 300a has a four-stack structure in which first to fourth semiconductor devices C1' to C4' are stacked on a package substrate S1'.

Referring to FIG. 3B, the semiconductor package 300b has an eight-stack structure in which first to eighth semiconductor devices C1" to C8" are stacked on a package substrate S1". However, a semiconductor package according to the inventive concept is not limited to semiconductor packages of four-stack and eight-stack structures and may include other numbers of stacked semiconductor devices.

Referring to FIGS. 3A and 3B, semiconductor devices, such as the first to third semiconductor devices C1' to C3' in FIG. 3A and the first to seventh semiconductor devices C1" to C7" in FIG. 3B, located between and electrically connected to upper and lower semiconductor devices may each have a step formed in their edges D. In addition, the semiconductor devices C1' to C3' and C1" to C7" may each have the modified region A formed inside their edges D. The steps and the modified regions A at the edges D may have similar technical features to those described with reference to FIGS. 2A and 2B, and thus, a detailed description thereof is omitted.

Also, in the examples of FIGS. 3A and 3B, semiconductor devices located at the bottom and the top of the semiconductor packages 300a and 300b, such as the package substrate S1' and the fourth semiconductor device C4' in FIG. 3A and the package substrate S1" and the eighth semiconductor device C8" in FIG. 3B, do not have steps and modified regions at edges thereof.

The semiconductor devices located at the top of the semiconductor packages 300a and 300b, such as the fourth semiconductor device C4' in FIG. 3A and the eighth semiconductor device C8" in FIG. 3B, do not need an electrical patterning process on a rear surface corresponding to a semiconductor device layer. Thus, a trench and a modified region are not formed on a rear surface of a semiconductor substrate having semiconductor devices formed thereon. Therefore, the fourth semiconductor device C4' in FIG. 3A and the eighth semiconductor device C8" in FIG. 3B may not have steps at edges thereof and modified regions inside the edges.

Components of the semiconductor devices of the semiconductor packages 300a and 300b shown in FIGS. 3A and 3B may have similar technical features to those of the semiconductor devices described with reference to FIG. 1, and thus, a detailed description thereof is omitted.

Figure 4A:
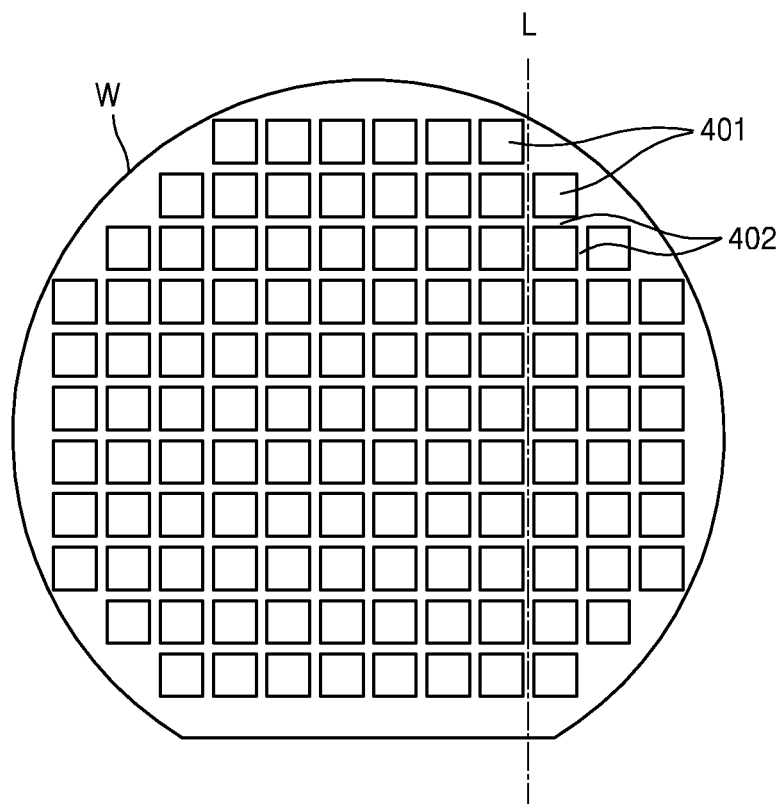
FIG. 4A is a top view of an article of manufacture including a semiconductor substrate to be diced into semiconductor devices, according to an example of the inventive concept.

FIG. 4A is a top view of a semiconductor substrate W according to an example of the inventive concept.

In more detail, FIG. 4A is a top view of the semiconductor substrate W including a plurality of semiconductor devices to be stacked inside semiconductor packages. The semiconductor substrate W may include any one of a wafer, a carrier substrate, and a PCB. The semiconductor substrate W may include, at an upper surface thereof, a plurality of semiconductor devices in dies constituted by a semiconductor device layer 401, and each of the dies constituted by the semiconductor device layer 401 may include a plurality of individual devices as described with reference to FIG. 1. The dies constituted by the semiconductor device layer 401 may be spaced apart by a certain distance from each other by scribe lanes 402. No semiconductor devices are present in the scribe lanes 402. The semiconductor substrate W may be diced into a plurality of the dies along virtual dicing lines L confined to the scribe lanes 402.

Figure 4B:
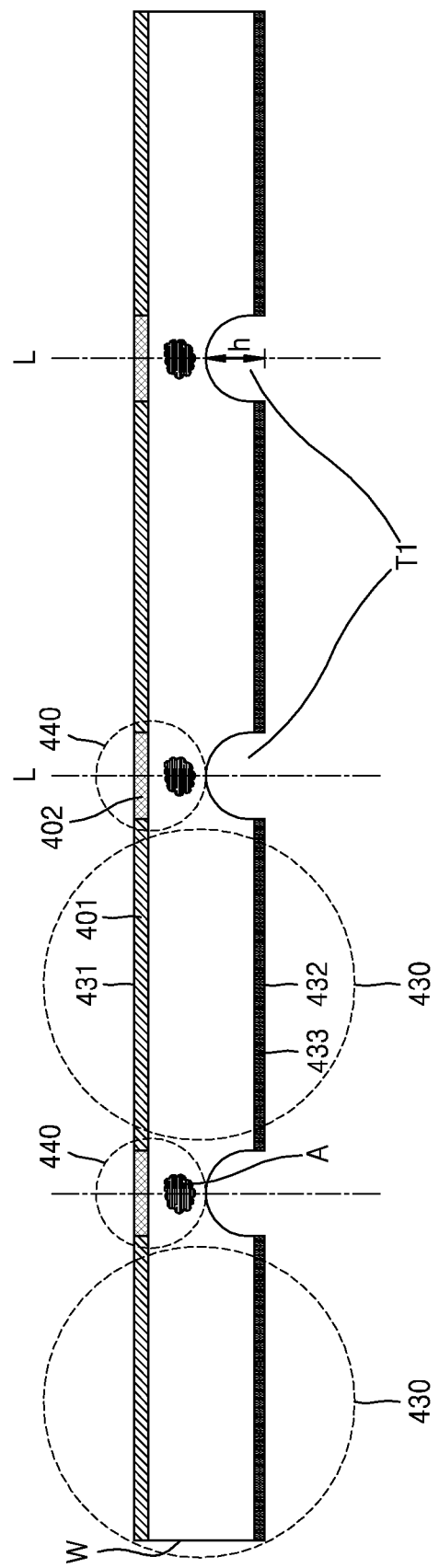
FIG. 4B is a cross-sectional view of the article of manufacture having one example of a trench in the substrate thereof according to an example of the inventive concept.
Figure 4C:
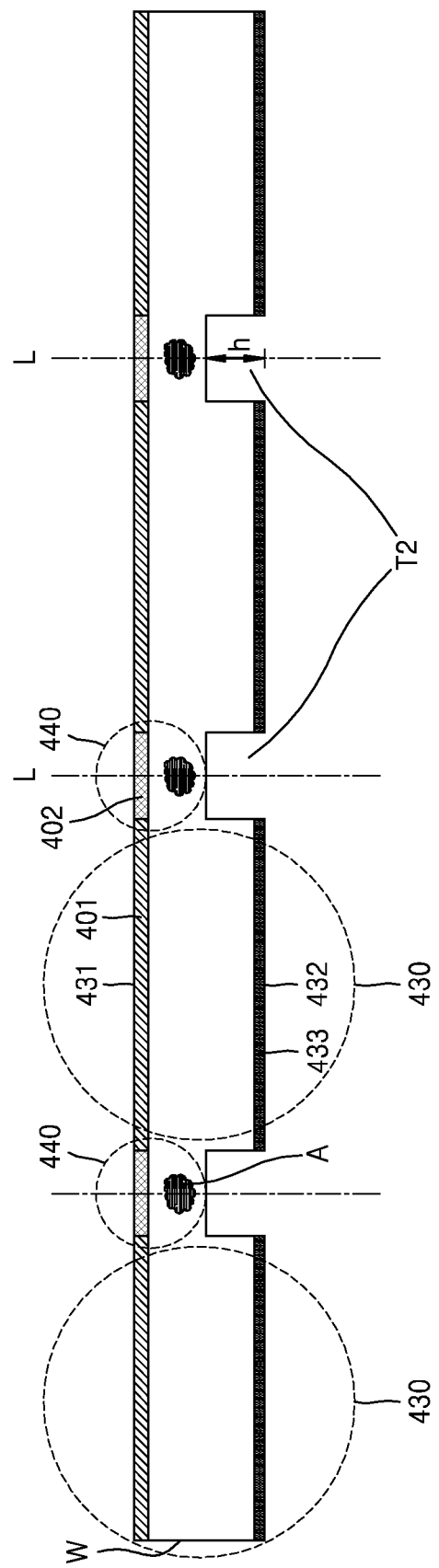
FIG. 4C is a cross-sectional view of the article of manufacture having another example of the trench in the substrate thereof according to an example of the inventive concept.

FIGS. 4B and 4C are cross-sectional views of examples of the semiconductor substrate W according to the inventive concept. In more detail, FIGS. 4B and 4C are cross-sectional views of the semiconductor substrate W including a plurality of semiconductor devices to be stacked inside semiconductor packages.

Referring to FIGS. 4B and 4C, the semiconductor substrate W may include a first region 430 and a second region 440.

The first region 430 of the semiconductor substrate W may include, on an upper surface 431, the semiconductor device layer 401 described above and include, under a lower surface 432, an electrical patterning layer 433. The semiconductor device layer 401 formed on the upper surface 431 is substantially the same as that described with reference to FIG. 1. The electrical patterning layer 433 formed under the lower surface 432 may be electrically connected to the semiconductor device layer 401 formed on the upper surface 431. In addition, the electrical patterning layer 433 may include a connection pad, and the connection pad may be electrically connected to a semiconductor device layer of another semiconductor device. The electrical patterning layer 433 under the lower surface 432 of the first region 430 may be generated by a photolithography process as will be described below.

The second region 440 of the semiconductor substrate W may include a scribe lane 402 at an upper portion thereof and the modified region A inside the upper portion. In addition, the second region 440 may include a trench T1 or T2 in a lower portion thereof.

The scribe lanes 402 may prevent electrical shorts from occurring between the semiconductor devices of the dies of the semiconductor substrate W. In addition, virtual dicing lines L along which the semiconductor substrate W is to be diced into a plurality of semiconductor devices are situated in and hence, defined by, the scribe lanes 402 as described above.

In addition, the modified region A inside the second region 440 of the semiconductor substrate W may be formed by using a stealth laser device that converges laser light at a location inside the second region 440 of the semiconductor substrate W. A detailed description of forming the modified region A is substantially the same as that described with reference to FIGS. 2A and 2B.

The formed modified region A may function as an align key in a photolithography process of forming the electrical patterning layer 433 under the lower surface 432 of the first region 430 of the semiconductor substrate W. In more detail, the stealth laser device may cause a crystal structure inside the second region 440 of the semiconductor substrate W to be amorphous, and a density of the amorphous modified region A generated by the stealth laser device may be less than a density of a crystalline region inside the semiconductor substrate W. Therefore, the modified region A may be highly visible and thus be readily aligned with a photomask in the photolithography process of forming the electrical patterning layer 433 under the lower surface 432 of the first region 430.

In addition, the trench formed in the lower portion of the second region 440 of the semiconductor substrate W may have various shapes. For example, referring to FIG. 4B, the trench T1 may have the shape of an arch, i.e., may have an arcuate profile. When the semiconductor substrate W including the arch-shaped trench T1 is diced into individual semiconductor devices (the dies referred to above), the individual semiconductor devices may have a concave surface defining a curved step in an edge thereof. Referring to FIG. 4C, the trench T2 may have a quadrangular (cross-sectional) shape. When the semiconductor substrate W including the quadrangular trench T2 is diced into individual semiconductor devices, the individual semiconductor devices may have planar surfaces defining a rectilinear step in an edge thereof. However, the inventive concept is not limited to the arch- or quadrangular-shaped trenches shown in FIG. 4B or 4C.

The trenches T1 and T2 shown in FIGS. 4B and 4C may be formed by various methods. For example, a trench may be mechanically formed in a lower part of the semiconductor substrate W by using a dicing device or chemically formed in a lower part of the semiconductor substrate W through a chemical reaction (etch process).

A height h of the trench T1 or T2 formed in a lower part of the semiconductor substrate W may be about 30% to about 80% of the thickness of the semiconductor substrate W. Preferably, the height h of the trench T1 or T2 may be about 50% to about 70% of the thickness of the semiconductor substrate W. According to examples of the inventive concept, the thickness of the semiconductor substrate W is about 50 μm, and the height h of the trench T1 or T2 is in a range of about 25 μm to about 35 μm.

When an align key is formed of a separate material protruding on the scribe lane as may be conventionally formed through a photolithography process, a trench is not formed in a lower part of the semiconductor substrate so that the align key can be prevented from being damaged by the trench forming process. Or even when such a trench is formed, the height of the trench is limited to again, prevent the align key from being damaged. On the contrary, according to the inventive concept, the amorphous modified region A inside the second region 440 of the semiconductor substrate W functions as an align key, and thus, the height h of the trench T1 or T2 formed in a lower part of the semiconductor substrate W may be relatively large.

Because the trench T1 or T2 may have a relatively large height h in a lower part of the scribe lane 402 of the semiconductor substrate W, it is not necessary, as will be described below, to dice a dicing tape in a process of dicing the semiconductor substrate W into individual semiconductor devices. Thus, an existing problem of a tape stretching due to its ductility without being cleanly diced may be obviated.

As described above, the semiconductor substrate W includes, as an align key, the modified region A adjacent the scribe lane 402, and thus the trench T1 or T2 may be formed relatively deep. Accordingly, the depth to which the semiconductor substrate W has to be diced is minimized. Therefore, the likelihood that a diced surface of a semiconductor device is chipped by the dicing process is reduced.

In addition, a step at an edge of a semiconductor device, which is formed due to the trench T1 or T2 of the semiconductor substrate W, may induce underflow of the connection film 170 shown in FIG. 1, such that the connection film 170 is accommodated in the edge. Accordingly, in an operation of manufacturing a semiconductor package, a fillet bridge is prevented from forming which would otherwise occur if the connection film 170 were to contact a connection film of a neighboring semiconductor package. Therefore, a warpage phenomenon of the semiconductor package due to such a fillet bridge may be prevented. In addition, a distance separating semiconductor devices formed on the semiconductor substrate W may be minimized to thereby increase a production yield of semiconductor packages.

Figure 5:
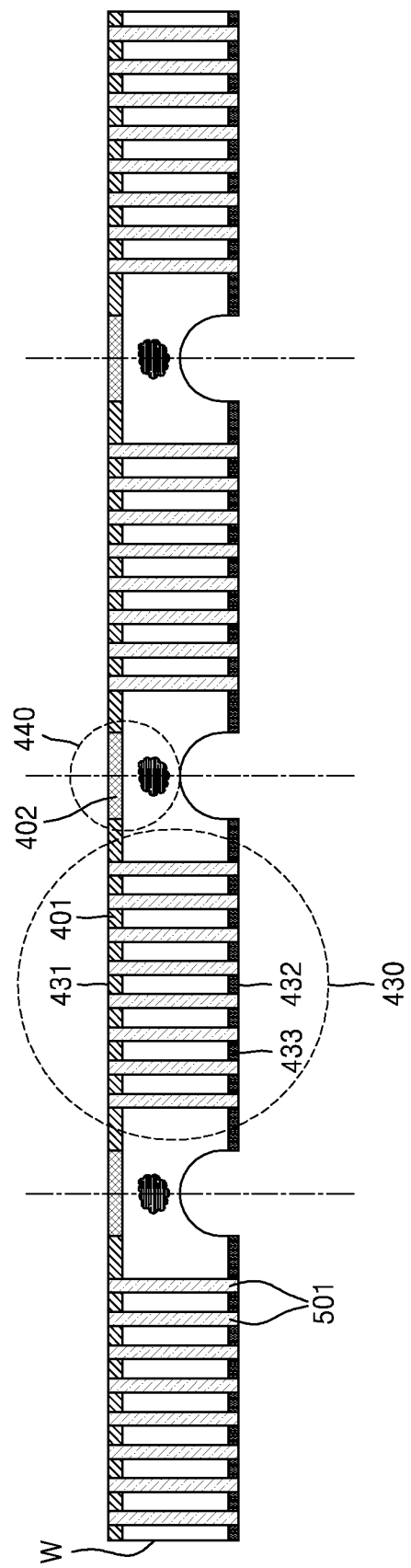
FIG. 5 is a cross-sectional view of the article of manufacture having a through electrode, according to an example of the inventive concept.

FIG. 5 is a cross-sectional view of the semiconductor substrate W having a through electrode 501, according to an example of the inventive concept.

Referring to FIG. 5, the through electrode 501 may electrically connect the semiconductor device layer 401 formed on the upper surface 431 of the first region 430 of the semiconductor substrate W and the electrical patterning layer 433 formed under the lower surface 432 of the first region 430. The through electrode 501 may comprise an electrically conductive pillar and although not shown in FIG. 5, may include a barrier film formed on the surface of the pillar and a buried conductive layer inside the barrier film.

Figure 6A:
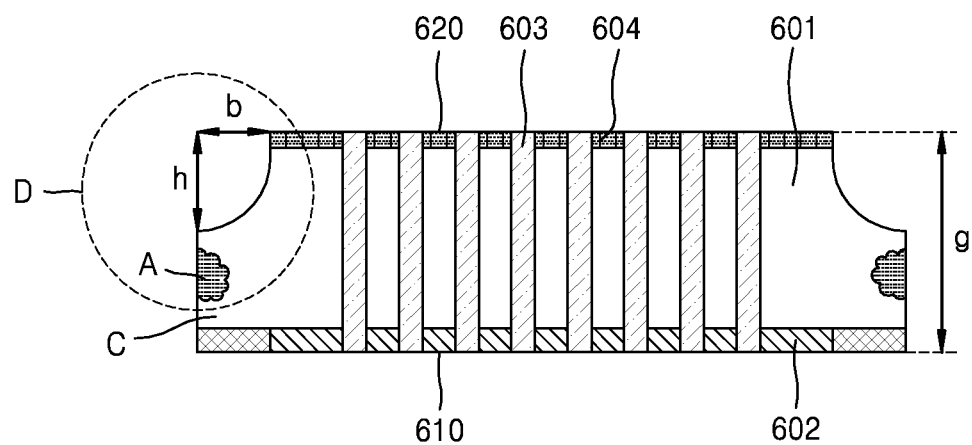
FIG. 6A is a cross-sectional view of a semiconductor device according to an example of the inventive concept.
Figure 6B:
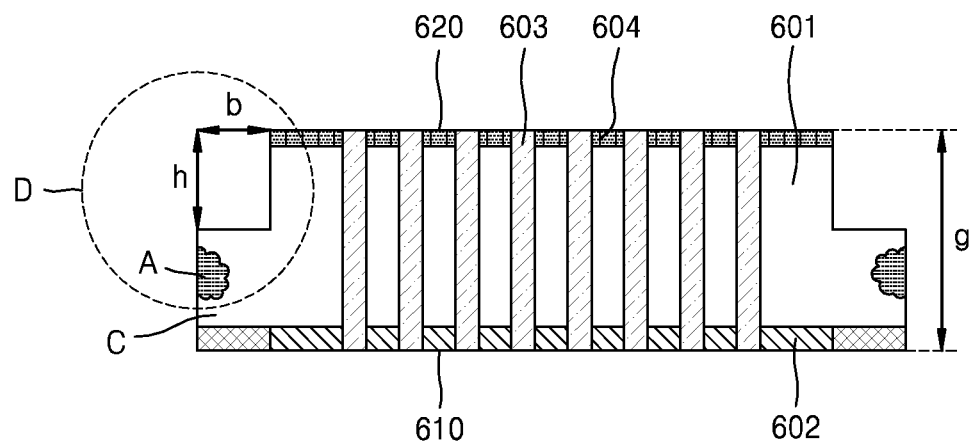
FIG. 6B is a cross-sectional view of a semiconductor device according to another example of the inventive concept.

FIGS. 6A and 6B are cross-sectional views of a semiconductor device C according to the inventive concept.

Referring to FIGS. 6A and 6B, the semiconductor device C may include a semiconductor substrate 601, a semiconductor device layer 602, an electrical patterning layer 604, and a through electrode 603. In more detail, the semiconductor device C may include a first surface 610 and a second surface 620 opposite to the first surface 610. The first surface 610 of the semiconductor device C may include the semiconductor device layer 602. The semiconductor device layer 602 may have similar technical features as those of the first semiconductor device layer 142 of FIG. 1, and thus, a detailed description of the semiconductor device layer 602 is omitted.

In addition, the second surface 620 of the semiconductor device C may include the electrical patterning layer 604. The electrical patterning layer 604 formed on the second surface 620 of the semiconductor device C may be electrically connected to the semiconductor device layer 602 formed under the first surface 610 of the semiconductor device C. In addition, the electrical patterning layer 604 may include a connection pad electrically connected to the electrical patterning layer 604, and the connection pad may be electrically connected to a semiconductor device layer of another semiconductor device.

The through electrode 603 of the semiconductor device C may electrically connect the semiconductor device layer 602 formed under the first surface 610 and the electrical patterning layer 604 formed on the second surface 620. The through electrode 603 may comprise an electrically conductive pillar. In addition, although not shown in FIGS. 6A and 6B, the through electrode 603 may include a barrier film formed on the surface of the pillar and a buried conductive layer inside the barrier film.

The semiconductor device C may have a step at an edge D. The edge D may have a concave step as shown in FIG. 6A or a rectilinear step as shown in FIG. 6B. However, the step in the edge D of the semiconductor device C according to the inventive concept is not limited to such shapes.

A height h of the step at the edge D of the semiconductor device C may be about 30% to about 80% of a thickness g of the semiconductor device C. Preferably, the height h of the step at the edge D of the semiconductor device C is about 50% to about 70% of the thickness g of the semiconductor device C. According to examples of the inventive concept, the thickness g of the semiconductor device C is about 50 rpm, and the height h of the step is in a range of about 25 µm to about 35 µm.

In addition, an area of the first surface 610 of the semiconductor device C differs from an area of the second surface 620 thereof. In particular, the area of the first surface 610 of the semiconductor device C is greater than the area of the second surface 620. A horizontal distance b measured from the top of the second surface 620 to the bottom of the first surface 610 may be about 30 µm to about 100 µm. Preferably, the horizontal distance b is in a range of about 50 µm to about 60 µm.

In addition, and still referring to FIGS. 6A and 6B, the semiconductor device C may further include the modified region A inside the edge D. The modified region A may be exposed to the outside at a side of the semiconductor device C. The method of forming the modified region A and improvements afforded by the modified region A are substantially the same as described with reference to FIGS. 4B and 4C.

As described above with reference to FIGS. 4B and 4C, the modified region A may be formed as an align key such that a depth of a trench of the semiconductor device C is relatively large. Therefore, a diced depth g-h of the semiconductor device C in a dicing process is minimized, and thus the likelihood of chipping occurring at a diced surface of the semiconductor device C may be reduced.

In addition, due to the trench of the semiconductor device C, it is not necessary to dice a tape in a semiconductor substrate dicing process, and thus, contamination of the semiconductor device C due to the tape may be reduced.

Referring to FIGS. 6A and 6B, the step at the edge D of the semiconductor device C may induce underflow of a connection film located on the second surface 620 of the semiconductor device C. Accordingly, in an operation of manufacturing a semiconductor package, a fillet bridge is prevented from forming which would otherwise occur if the connection film were to contact a connection film of a neighboring semiconductor package. Therefore, a warpage phenomenon of the semiconductor package due to such a fillet bridge may be prevented. In addition, a distance separating semiconductor devices formed on the semiconductor substrate W may be minimized to thereby increase a production yield of semiconductor packages.

FIGS. 7 to 18 illustrate a method of manufacturing a semiconductor package, according to the inventive concept.

Figure 7:
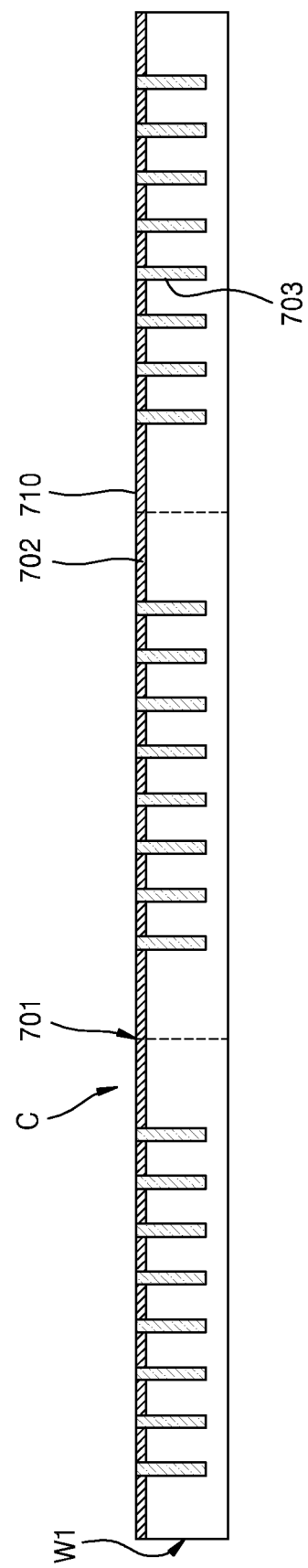

Referring to FIG. 7, first, a semiconductor device is formed at an upper portion of a semiconductor substrate W1 and a through electrode is formed in the semiconductor substrate W1.

The semiconductor substrate W1 may include a plurality of semiconductor devices C partitioned by scribe lanes 701. The semiconductor device C may include a first semiconductor device layer 702 and a first through electrode 703. The first through electrode 703 may extend from a first upper surface 710 of the semiconductor substrate W1 into the semiconductor substrate W1. At least a portion of the first through electrode 703 may have the form of a pillar. The first through electrode 703 may include a barrier film formed on the portion in the form of a pillar and a buried conductive layer inside the barrier film. In addition, although not shown in FIG. 7, a via insulating film may be interposed between the semiconductor substrate W1 and the first through electrode 703.

Figure 8:
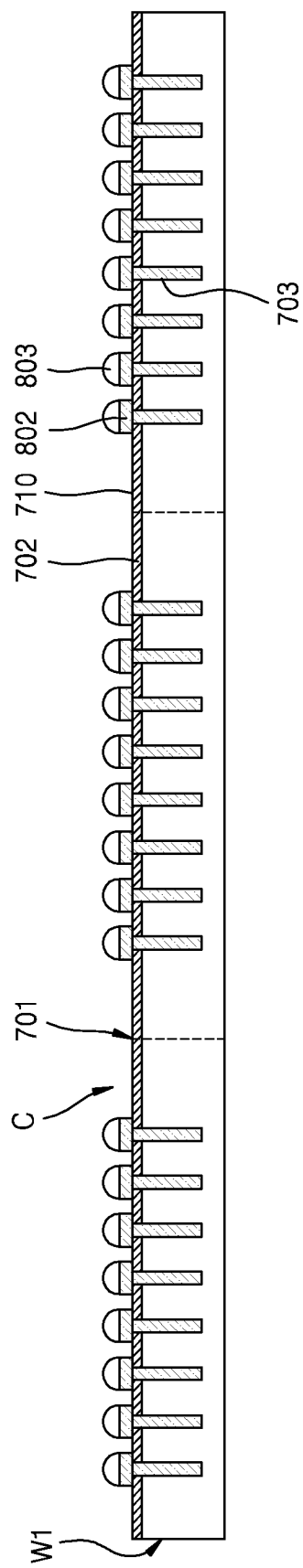

Referring to FIG. 8, next, a first connection pad 802 is formed as electrically connected to the first through electrode 703 of the semiconductor substrate W1. After forming the first connection pad 802, a first connection bump 803 may be formed as electrically connected to the first through electrode 703 through the first connection pad 802. Although not shown in FIG. 8, the first connection bump 803 may include a pillar structure and a solder layer. To form the first connection bump 803, a mask pattern having an opening through which a portion of the first connection pad 802 is exposed may be formed on the first semiconductor device layer 702. Subsequently, the pillar structure and the solder layer may be sequentially formed on the portion of the first connection pad 802 exposed by the mask pattern. The pillar structure and the solder layer may be formed by performing an electroplating process.

Figure 9:
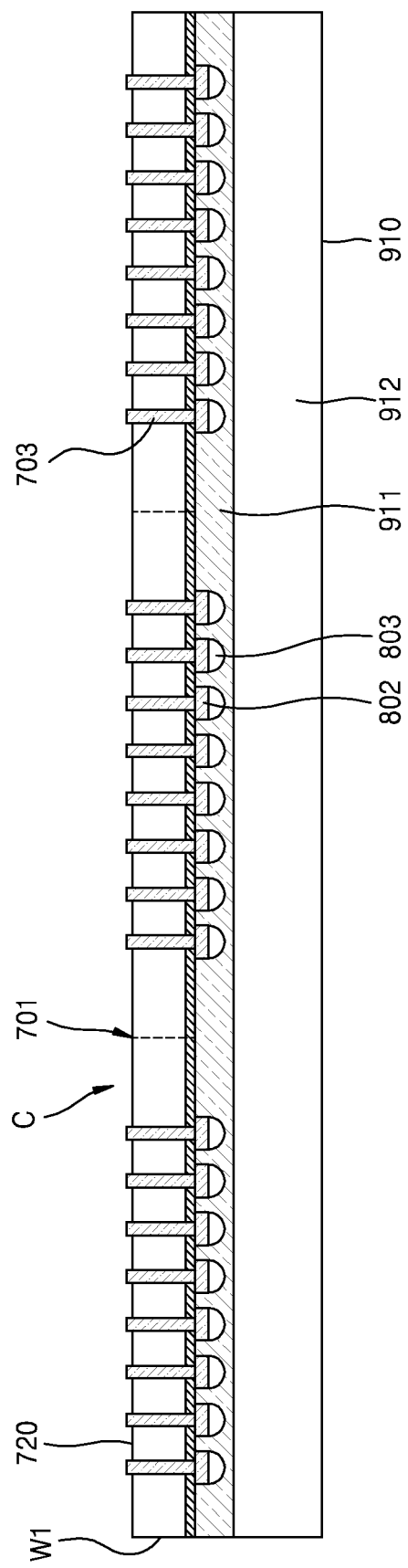

Referring to FIG. 9, next, a carrier substrate 910 may be attached to the semiconductor substrate W1. The carrier substrate 910 may include a support substrate 912 and an adhesive material layer 911. The semiconductor substrate W1 may be attached to the carrier substrate 910 such that the first connection bump 803 faces the carrier substrate 910. Therefore, the first connection bump 803 may be encapsulated by the adhesive material layer 911.

In addition, a portion of a lower surface 720 of the semiconductor substrate W1 may be removed to expose the first through electrode 703 to the outside. A chemical mechanical polishing (CMP) process, an etch-back process, or a combination thereof may be used to expose the first through electrode 703 to the outside.

Figure 10:
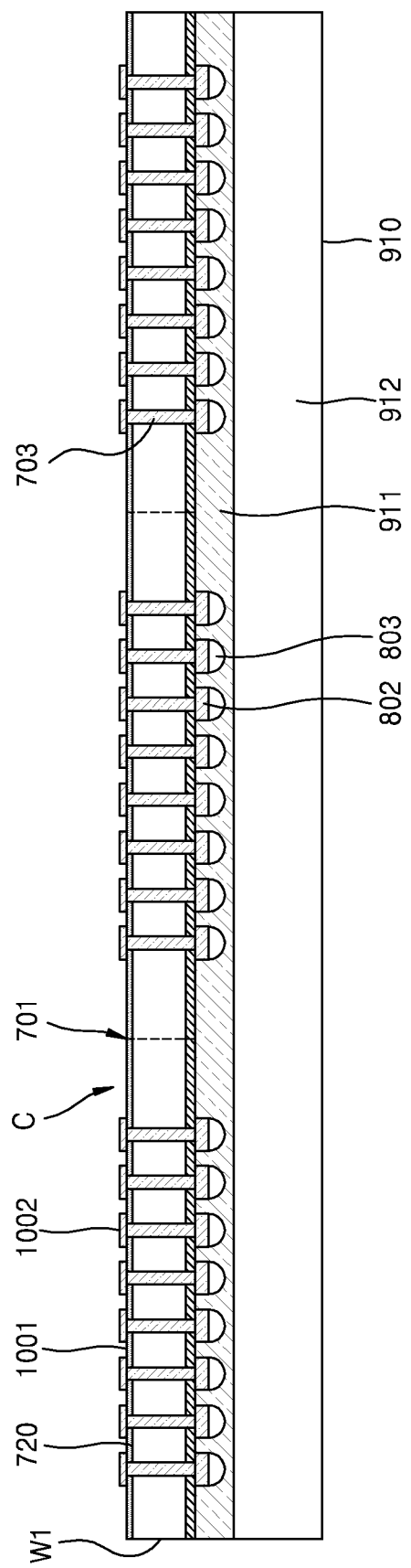

Referring to FIG. 10, a protective layer 1001 covering the lower surface 720 of the semiconductor substrate W1 may be formed. The protective layer 1001 may be formed by, for example, a spin coating process or a spray process. The protective layer 1001 may be made of, for example, an insulating polymer. An insulating polymer film covering the lower surface 720 of the semiconductor substrate W1 and the first through electrode 703 which is exposed to the outside may be formed to form the protective layer 1001, and then a portion of the insulating polymer film may be removed through an etch-back process to expose the first through electrode 703 to the outside.

Referring to FIG. 10, after the protective layer 1001 has been formed, a first upper connection pad 1002 electrically connected to the first through electrode 703 exposed to the outside through the protective layer 1001 may be formed.

Figure 11:
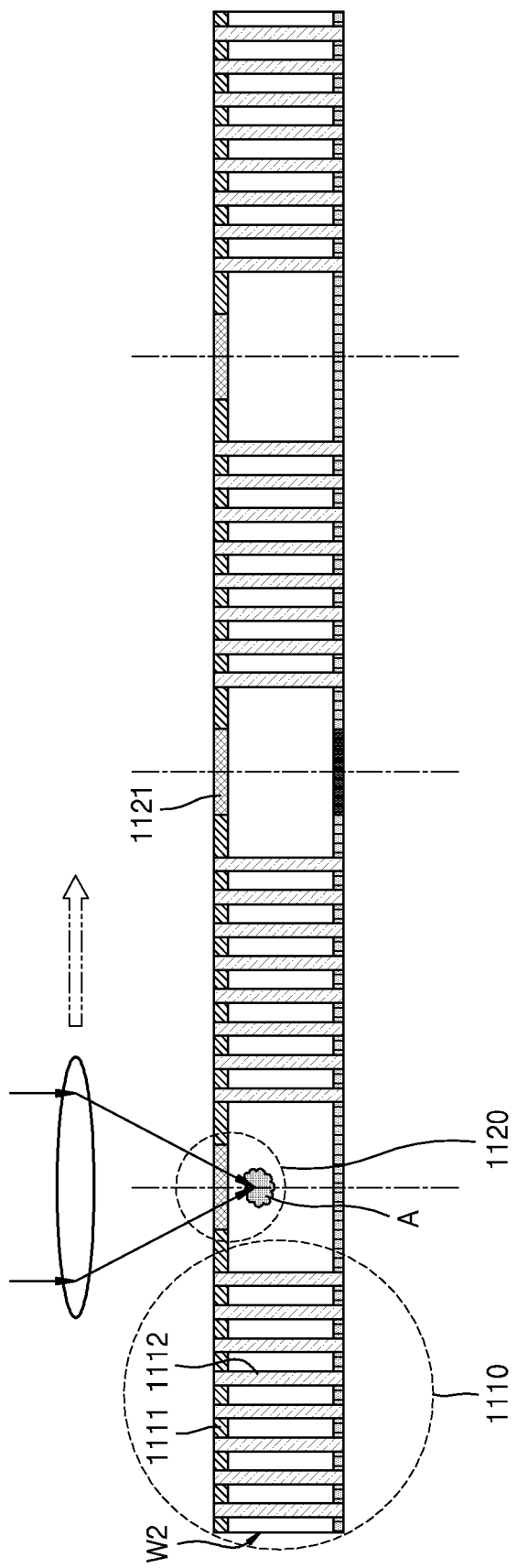

FIG. 11 illustrates forming a modified region inside a semiconductor substrate W2 including semiconductor devices.

Referring to FIG. 11, the semiconductor substrate W2 including semiconductor devices may include a plurality of first regions 1110 and a plurality of second regions 1120. The first region 1110 may include a second semiconductor device layer 1111 on an upper surface thereof, and in addition, a second through electrode 1112 electrically connected to the second semiconductor device layer 1111 may be formed inside the first region 1110.

In addition, the semiconductor substrate W2 may include a scribe lane 1121 on an upper portion of the second region 1120.

A modified region A may be formed, by a stealth laser device, inside the second region 1120 of the semiconductor substrate W2. In more detail, the stealth laser device may use a lens to converge laser light of a wavelength, capable of passing through the semiconductor substrate W2, on a point inside the second region 1120 of the semiconductor substrate W2. As a result, very high nonlinear multiple photon absorption may occur near the light converging point. Due to the nonlinear multiple photon absorption, crystals in the second region 1120 of the semiconductor substrate W2 may absorb energy of the light concentrated inside the semiconductor substrate W2 to cause a hot-melting phenomenon, thereby forming amorphous modified region A as shown in FIG. 11.

The amorphous modified region A formed inside the second region 1120 of the semiconductor substrate W2 may be used as an align key for alignment with a photomask in a photolithography process of forming an electrical patterning layer under a lower surface of the first region 1110 of the semiconductor substrate W2.

Figure 12:
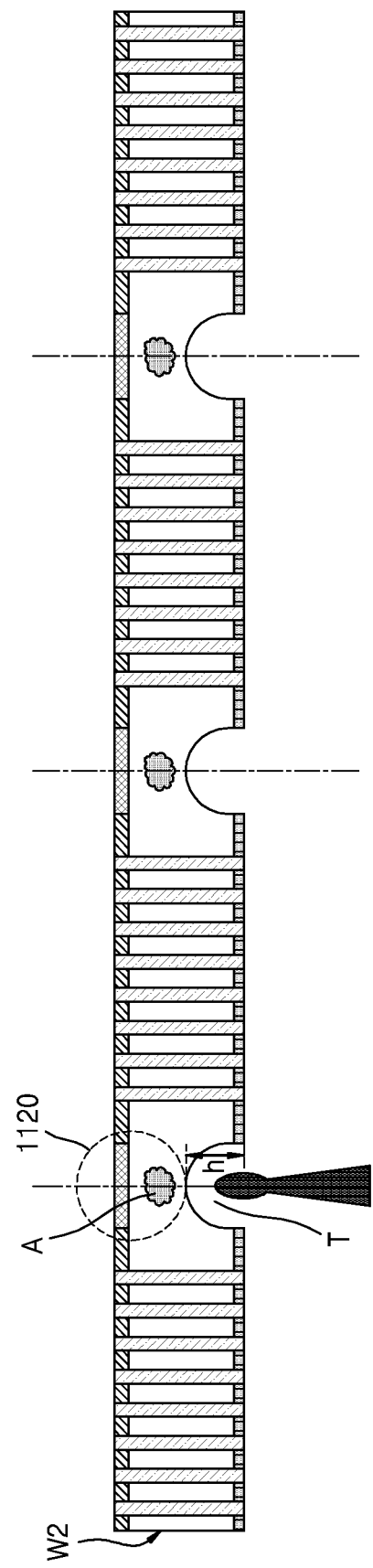

FIG. 12 illustrates the forming of a trench T in a lower part of the semiconductor substrate W2.

The trench T may be formed by various methods. For example, the trench T may be mechanically formed in a lower part of the semiconductor substrate W2 by using a dicing device or chemically formed in a lower part of the semiconductor substrate W2 through a chemical reaction.

As described with reference to FIG. 11, the modified region A formed inside the second region 1120 of the semiconductor substrate W2 functions as an align key, and thus, there is no concern about the align key being damaged in the process of forming the trench T. Also, according to the inventive concept, the trench T formed in a lower part of the second region 1120 of the semiconductor substrate W2 may have a relatively great depth h. In particular, the depth h of the trench T may be about 50% to about 70% of a thickness of the semiconductor substrate W2. According to an example of the inventive concept, the thickness of the semiconductor substrate W2 is about 50 µm, and the depth h of the trench T is in a range of from about 25 µm to about 35 µm.

Due to the trench T formed in a lower part of the second region 1120 of the semiconductor substrate W2, it is not necessary, as to be described with reference to FIG. 14A, to dice a tape in a process of dicing the semiconductor substrate W2 into individual semiconductor devices. Thus, an existing problem in which the dicing tape stretches due to its ductility without being cleanly diced may be obviated. In addition, the likelihood of chipping at a diced surface of the individual semiconductor device may be reduced.

Figure 13:
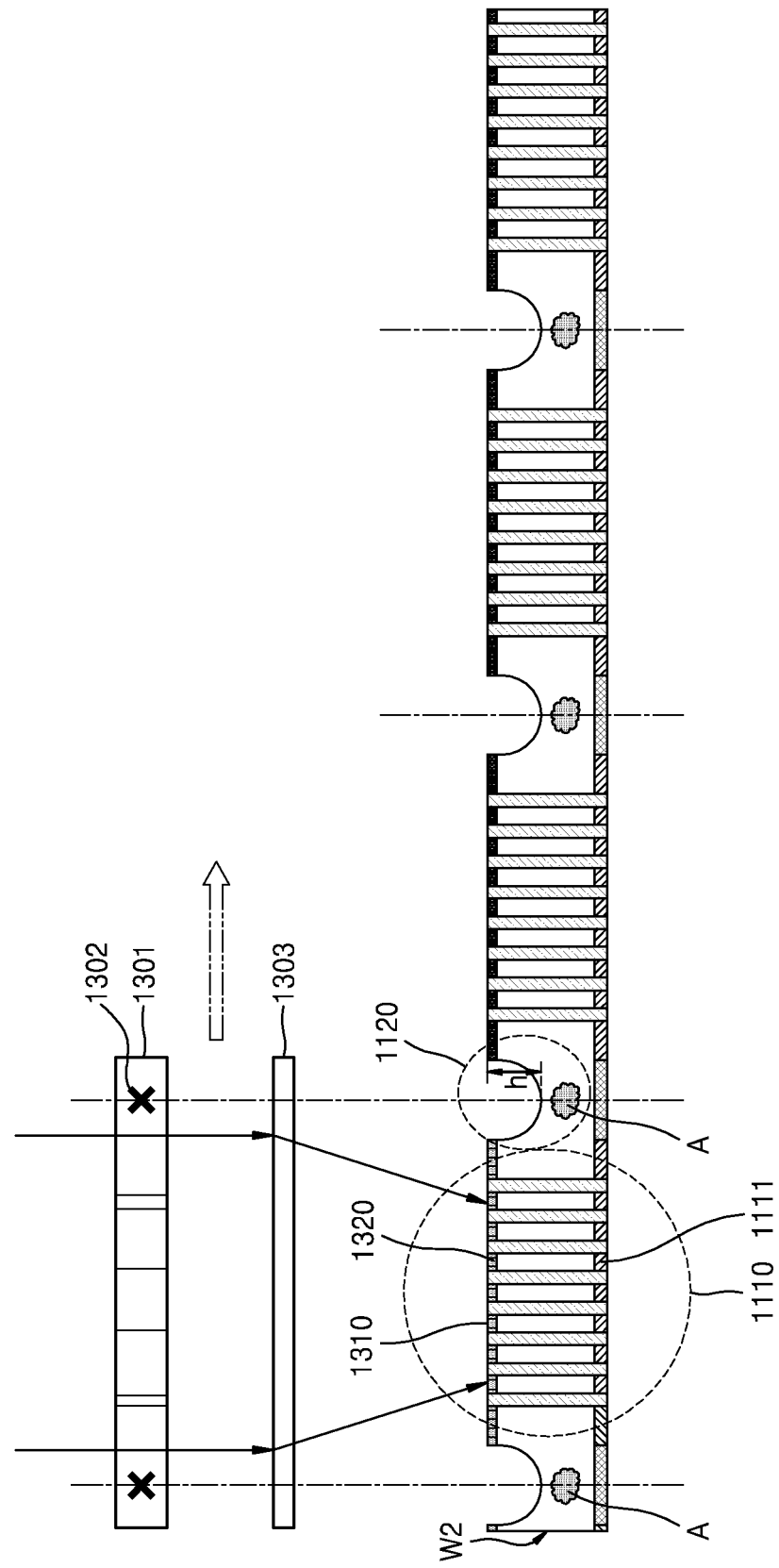

FIG. 13 illustrates a process of forming an electrical patterning layer 1320 at a lower surface of the semiconductor substrate W2.

The electrical patterning layer 1320 may be formed by a photolithography process on a surface 1310 corresponding to the second semiconductor device layer 1111 in the first region 1110 of the semiconductor substrate W2. For the photolithography process of forming the electrical patterning layer 1320, a photomask 1301 and a condensing lens 1303 may be used. The photomask 1301 may include an align mark 1302. The align mark 1302 of the photomask 1301 may be aligned with the amorphous modified region A formed inside the second region 1120 of the semiconductor substrate W2. Once the alignment is completed, the surface 1310 corresponding to the second semiconductor device layer 1111 in the first region 1110 of the semiconductor substrate W2 may be uniformly coated with a sensitizing (photosensitive) solution. Then light is selectively emitted on the surface of the layer of sensitizing solution by the photomask 1301, and the sensitizing solution is developed to selective remove the exposed or non-exposed portion of the layer, whereby a patterned layer of the sensitizing solution may be formed on the surface 1310 corresponding to the second semiconductor device layer 1111. The electrical patterning layer 1320 may be finally formed through a process of filling the patterned layer with conductive material comprising a metal.

Figure 14A:
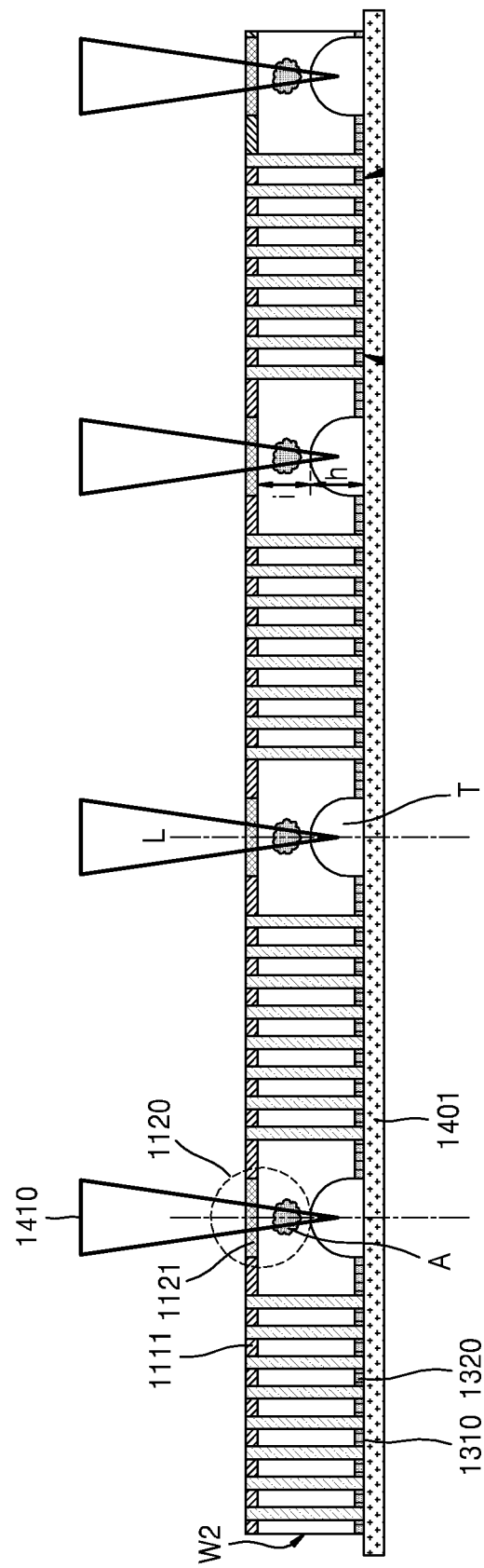
Figure 14B:
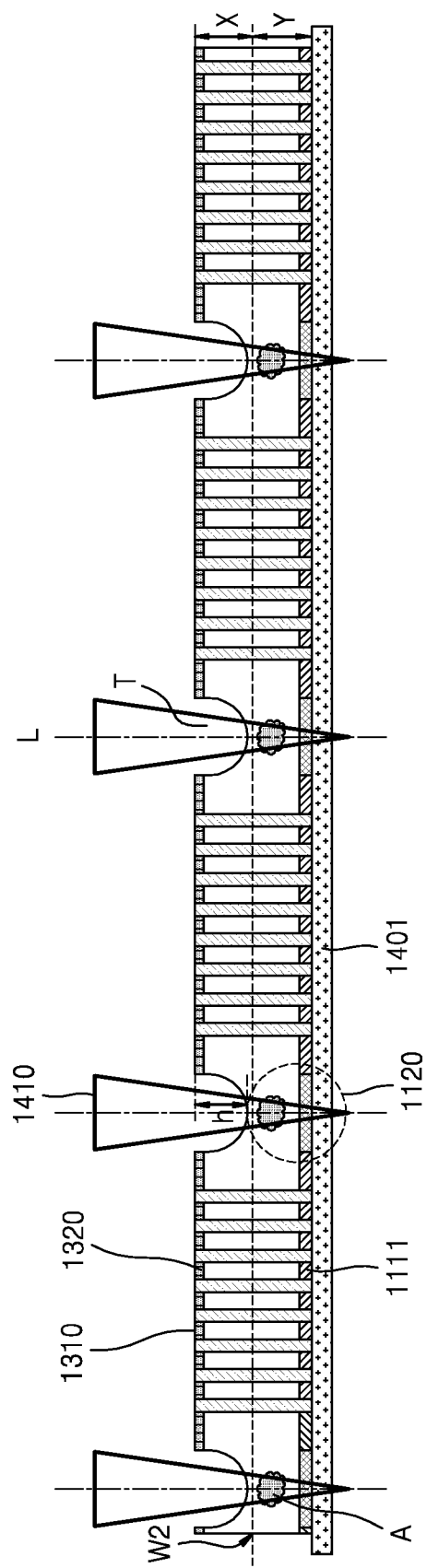

FIGS. 14A and 14B illustrate respective examples of dicing the semiconductor substrate W2 into individual semiconductor devices or "dies".

Referring to FIG. 14A, a semiconductor substrate dicing device 1410 may divide the semiconductor substrate W2 into individual semiconductor devices by dicing the second region 1120 of the semiconductor substrate W2 along a virtual dicing line L in the scribe lane 1121 of the second region 1120 of the semiconductor substrate W2. The semiconductor substrate dicing device 1410 may, for example, use a dicing blade or a stealth laser for dicing. However, the inventive concept is not limited to the use of any particular semiconductor substrate dicing device.

Still referring to FIG. 14A, a tape for dicing 1401 may be attached to the surface 1310 (that is, a surface having the electrical patterning layer 1320) corresponding to the second semiconductor device layer 1111 of the semiconductor substrate W2. The tape for dicing 1401 may prevent the semiconductor devices diced from the semiconductor substrate W2 in the dicing process from being scattered. When the tape for dicing 1401 is attached to the semiconductor substrate W2, an air gap may be formed by the trench T in the second region 1120 between the tape for dicing 1401 and the semiconductor substrate W2.

In a case in which the a semiconductor substrate without a trench T is diced into individual semiconductor devices, the tape for dicing can be stretched and plastically deformed by a substrate dicing device. As a result, the diced surface of the semiconductor substrate might chip. These chips can contaminate the semiconductor substrate, and reduce the production yield of semiconductor devices from the semiconductor substrate.

However, in the process of dicing the semiconductor substrate W2 according to the inventive concept, the semiconductor substrate dicing device 1410 may dice the semiconductor substrate W2 into individual semiconductor devices without dicing the tape for dicing 1401 due to the trench T formed in a lower part of the second region 1120 of the semiconductor substrate W2. Therefore, the above-described phenomenon in which the tape for dicing stretches and deforms without being cleanly diced, resulting in the diced semiconductor devices being contaminated, may be prevented.

In addition, as described above, the modified region A formed, by a stealth laser device, inside the second region 1120 of the semiconductor substrate W2 functions as an align key and thus, the height h of the trench T may be about 50% to about 70% of the thickness of the semiconductor substrate W2. Therefore, the semiconductor substrate dicing device 1410 does not have to dice a thickness of the semiconductor substrate W2 corresponding to the height h of the trench T. Therefore, a diced depth i to be diced by the semiconductor substrate dicing device 1410 in the second region 1120 of the semiconductor substrate W2 is relatively small. Accordingly, a chipping of the semiconductor substrate W2 at its surfaces where the diced individual semiconductor devices are located may be minimized or prevented.

Referring to FIG. 14B, in this example the tape for dicing 1401 is attached to a surface at which the second semiconductor device layer 1111 of the semiconductor substrate W2 is formed. The semiconductor substrate W2 may include a first layer X of a thickness which includes the trench T and a second layer Y without the trench T. As shown in FIG. 14B, the first layer X may include the electrical patterning layer 1320, and the second layer Y may include the second semiconductor device layer 1111.

The first layer X and the second layer Y of the semiconductor substrate W2 may include mutually different materials. In addition, the first layer X may be weaker than the second layer Y. For example, the material of the first layer X may be a silicon-based material, and the material of the second layer Y may be an epoxy-based material.

The first layer X in the second region 1120 of the semiconductor substrate W2 has the trench T. Thus, the semiconductor substrate dicing device 1410 may start dicing the semiconductor substrate W2 from the second layer Y in the second region 1120 and without dicing the first layer X in the second region 1120. Therefore, the range of choices for the dicing blade of the semiconductor substrate dicing device 1410 may be wide, and the dicing process may be carried out quickly. In addition, the semiconductor substrate dicing device 1410 only must dice through the thickness of the second layer Y in the second region 1120 of the semiconductor substrate W2. Thus, a chipping phenomenon at surfaces of the diced individual semiconductor devices may be minimized or prevented.

Figure 15:
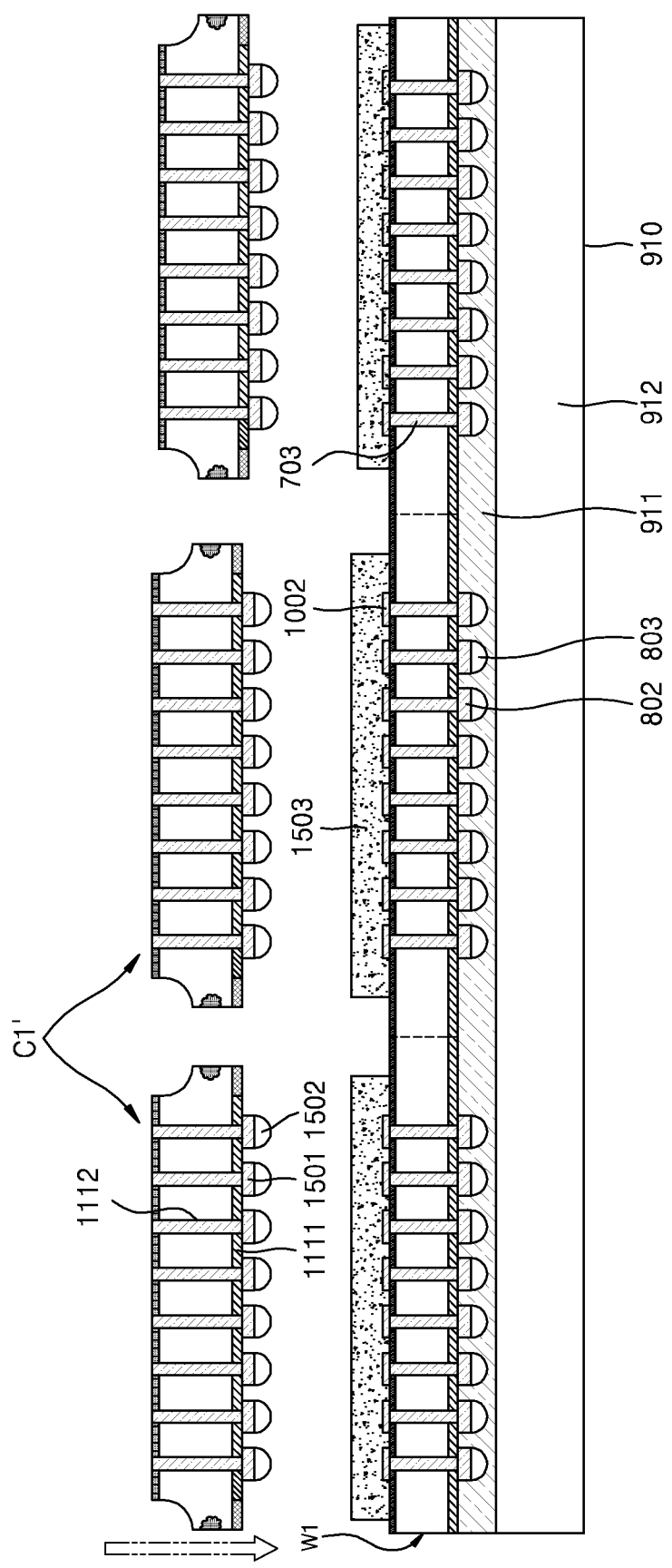

FIG. 15 illustrates an operation of stacking semiconductor devices on the semiconductor substrate W1 and electrically connecting the semiconductor devices to the semiconductor substrate W1.

Referring to FIG. 15, a second connection pad 1501 and a second connection bump 1502 electrically connected to the second semiconductor device layer 1111 may be formed on the second semiconductor device layer 1111 of each of a plurality of semiconductor devices C1' to be stacked.

A connection film 1503 may be formed on the first upper connection pad 1002 of the semiconductor substrate W1. The connection film 1503 may be of an insulating polymer, and more specifically, the connection film 1503 may be a nonconductive film (NCF).

The second connection bump 1502 of each of the plurality of semiconductor devices C1' to be stacked may be arranged so as to correspond to the first upper connection pad 1002 of the semiconductor substrate W1. The plurality of semiconductor devices C1' may be stacked on the semiconductor substrate W1 such that the second connection bump 1502 of each of the plurality of semiconductor devices C1' comes into contact with the first upper connection pad 1002 of the semiconductor substrate W1 to electrically connect the first through electrode 703 to the second through electrode 1112.

Once the plurality of semiconductor devices C1' have been stacked on the connection film 1503 on the semiconductor substrate W1, a reflow process or a thermal compression process may be performed. As a result of this process, the second connection bump 1502 may come into contact with and be electrically connect to the first upper connection pad 1002.

Figure 16:
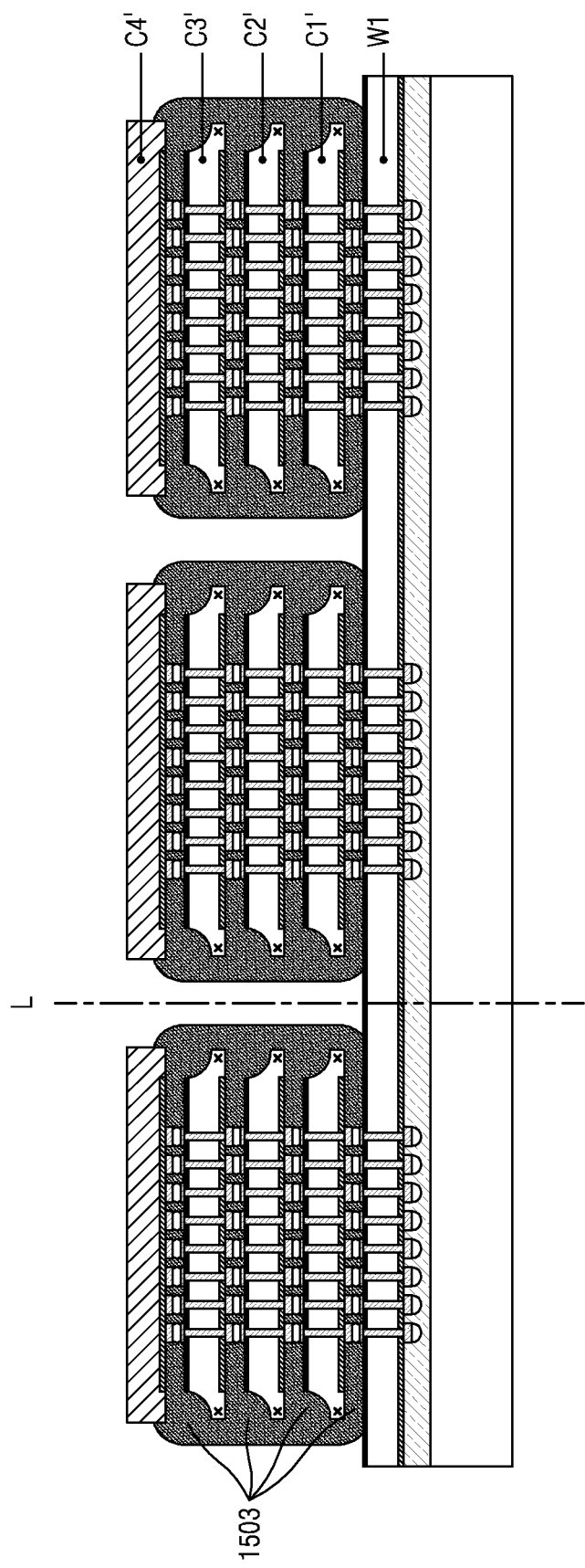

Referring to FIG. 16, the stacking process described with reference to FIG. 15 may be repeated. Accordingly, semiconductor devices C1', C2', C3', and C4' may be stacked on the semiconductor substrate W1. The connection film 1503 may be located between the stacked semiconductor devices C1', C2', C3', and C4', and the semiconductor devices C1', C2', C3', and C4' may be electrically connected through the process described above.

In the stacking process shown in FIG. 16, the connection film 1503 may be extruded by pressure exerted by the stacked semiconductor devices C1', C2', C3', and C4' outside a footprint of the stacked semiconductor devices C1', C2', C3', and C4'. In the illustrated example, the connection film 1503 does not reach the virtual dicing line L. Therefore, in this example, the connection film 1503 can not be viewed by the naked eye from the sides of the diced semiconductor package.

In another example, the connection film 1503 extruded outside a footprint of the stacked semiconductor devices C1', C2', C3', and C4' comes into contact with another extruded connection film to form a fillet bridge. The fillet bridge formed by the connection film 1503 is visible to the naked eyes from the sides of the diced semiconductor packages. A shape and thickness of the connection film 1503 viewed from a side surface of a diced semiconductor package may allow for a check to made as to whether the semiconductor devices C1', C2', C3', and C4' in the semiconductor package are stacked with proper intervals therebetween.

However, if such a fillet bridge of the connection film were to be formed to a certain thickness, the semiconductor package could warp in a process of manufacturing the semiconductor package. According to an example of the inventive concept, because the semiconductor devices C1', C2', C3', and C4' have a step at an edge thereof, underflow of the connection film 1503 may be induced. Thus, the thickness to which the fillet bridge may form due to the connection film 1503 in the semiconductor package may be limited. Accordingly, a warping of the semiconductor package may be suppressed.

Although FIG. 16 illustratively shows a structure in which four semiconductor devices C1', C2', C3', and C4' are stacked one on another on the semiconductor substrate W1, the number of semiconductor devices stacked on the semiconductor substrate W1 may vary. In addition, the semiconductor devices C1', C2', C3', and C4' may be homogeneous semiconductor devices including the same individual elements or heterogeneous semiconductor devices including different individual elements.

Figure 17:
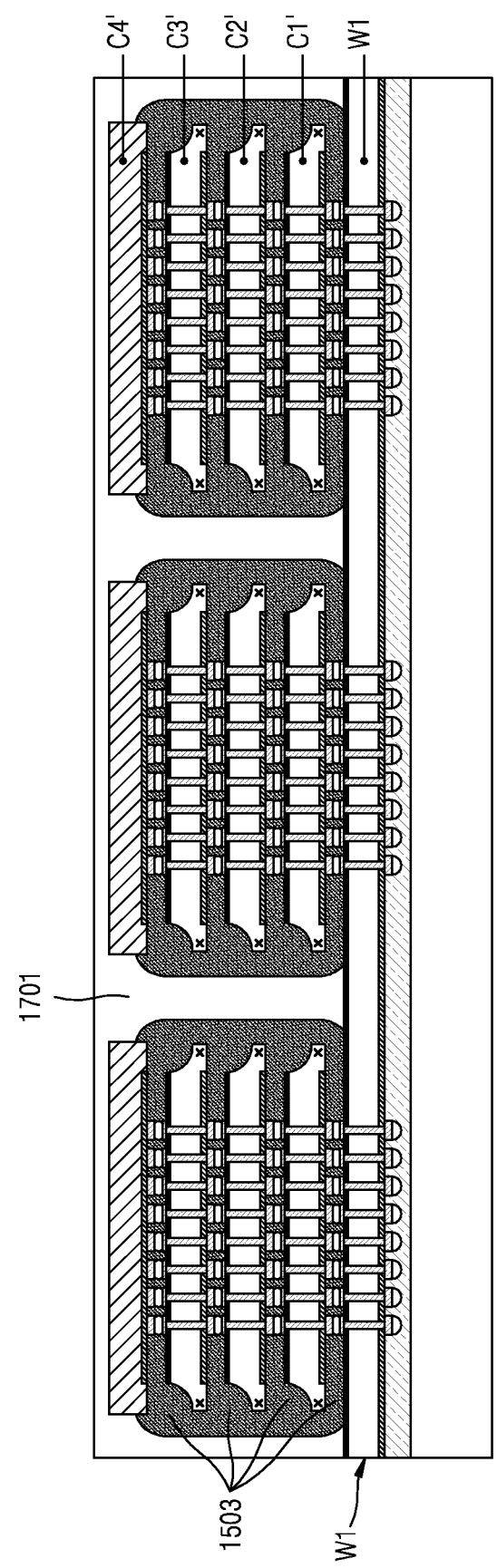

Referring to FIG. 17, next, an encapsulation material 1701 covering the semiconductor devices C1', C2', C3', and C4' stacked on the semiconductor substrate W1 may be formed. The encapsulation material 1701 may be formed to cover side surfaces of the stacked semiconductor devices C1', C2', C3', and C4' and to cover an upper surface of the top stacked semiconductor device C4'. In addition, the encapsulation material 1701 may cover the side surfaces of the connection film 1503. According to an example, the encapsulation material 1701 comprises an epoxy molding compound (EMC).

Figure 18:
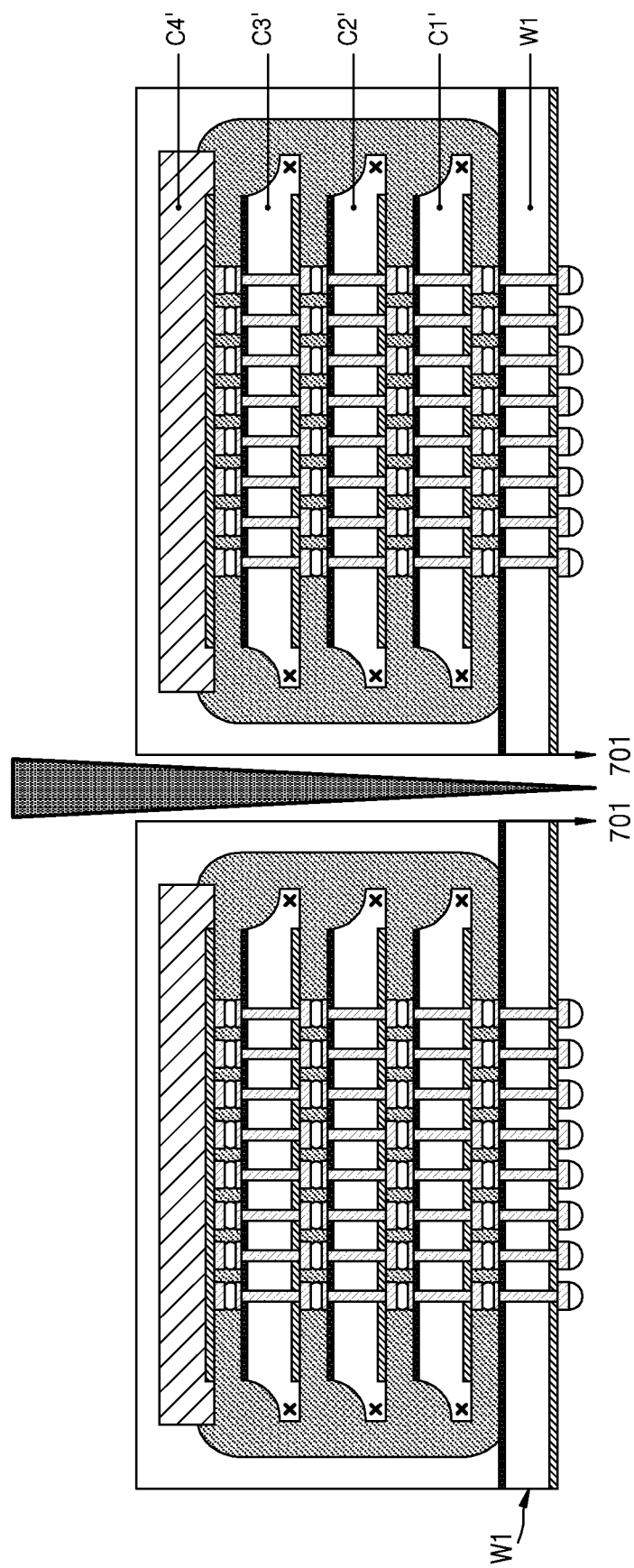

Referring to FIG. 18, the structure shown in and described with reference to FIG. 17 may be diced into individual semiconductor packages along the scribe lane 701 of the semiconductor substrate W1. The process of dicing the semiconductor packages may be performed by a dicing device using a dicing blade or a stealth laser.

Finally, although the inventive concept has been particularly shown and described with reference to examples thereof, it will be understood that various changes in form and details may be made to such examples without departing from the spirit and scope of the inventive concept as defined by the following claims.

What is claimed is:

1. A semiconductor package comprising:
a package substrate;
a first semiconductor device on an upper surface of the package substrate;
a second semiconductor device on an upper surface of the first semiconductor device;
a first connection bump attached to a lower surface of the package substrate;
a second connection bump interposed between and electrically connected to the package substrate and the first semiconductor device; and
a third connection bump interposed between and electrically connected to the first semiconductor device and the second semiconductor device,
wherein a step in the first semiconductor device is defined at an edge of the first semiconductor device,
the edge of the first semiconductor device has a modified region, and
a density of the modified region of the first semiconductor device is less than a density of a central region of the first semiconductor device.

2. The semiconductor package of claim 1, wherein the package substrate comprises a third semiconductor device having a semiconductor substrate and a first through electrode extending through the semiconductor substrate and electrically connected to the first semiconductor device, and
the first semiconductor device comprises a second semiconductor substrate and a second through electrode extending through the second semiconductor substrate and electrically connected to the second semiconductor device.

3. The semiconductor package of claim 2, wherein a height of the step at the edge of the first semiconductor device is in a range of 30% to 80% of a maximum thickness of the first semiconductor device.

4. The semiconductor package of claim 3, wherein the edge of the first semiconductor device has a concave curved surface defining the step.

5. The semiconductor package of claim 3, further comprising a connection film enveloping the first connection bump between an upper surface of the third semiconductor device and a lower surface of the first semiconductor device, and a connection film enveloping the second connection bump between the upper surface of the first semiconductor device and a lower surface of the second semiconductor device.

6. The semiconductor package of claim 5, wherein at least one of the connection films protrudes outside a combined footprint of the first semiconductor device and the second semiconductor device.

7. The semiconductor package of claim 6, wherein a side of at least one of the connection films forms part of a side surface of the semiconductor package.

8. A semiconductor package comprising:
a stack of vertically spaced apart components including a lower substrate, an upper semiconductor device and at least one intermediate semiconductor device interposed between the lower substrate and the upper semiconductor device;

underfill material interposed between the components and protruding laterally outwardly of a combined footprint of the upper and at least one intermediate semiconductor devices; and a molded layer encapsulating each said at least one intermediate semiconductor device and the underfill material on the lower substrate, wherein each said at least one intermediate semiconductor device includes a semiconductor substrate, the semiconductor substrate has a step therein constituting an edge of the intermediate semiconductor device, and a modified region constituting the edge, the underfill material fills in the step, and the modified region of the semiconductor substrate has a density different from that of material of the semiconductor substrate bordering the modified region.

9. The semiconductor package of claim 8, wherein the semiconductor substrate has opposite surfaces, and the intermediate semiconductor device further comprises:

a semiconductor device layer at one of the surfaces of the semiconductor substrate and constituting a first surface of the intermediate semiconductor device, an electrical pattern layer on the other of the surfaces of the semiconductor substrate and constituting a second surface of the intermediate semiconductor device, and through electrodes extending vertically through the semiconductor substrate and connecting the electrical pattern layer and the semiconductor device layer.

10. The semiconductor package of claim 9, wherein a footprint of the first surface of the intermediate semiconductor device has an area greater than that of the second surface of the intermediate semiconductor device.

11. The semiconductor package of claim 8, wherein a height of the step of the intermediate semiconductor device is in a range of 30% to 80% of a thickness of the intermediate semiconductor device as measured between the first surface and the second surface of the intermediate semiconductor device.

12. A semiconductor device comprising:

a semiconductor substrate having opposite surfaces;

a semiconductor device layer at one of the surfaces of the semiconductor substrate and constituting a first surface of a semiconductor device; and an electrical pattern layer on the other of the surfaces of the semiconductor substrate and constituting a second surface of the semiconductor device, wherein the semiconductor substrate has a step therein constituting an edge of the semiconductor device, the semiconductor substrate has a modified region constituting the edge of the semiconductor device, and a density of the modified region of the semiconductor substrate is less than a density of a central region of the semiconductor substrate.

13. The semiconductor device of claim 12, wherein the step is defined by a concave curved surface of the semiconductor substrate.

14. The semiconductor device of claim 12, wherein a height of the step is in a range of 30% to 80% of a maximum thickness of the semiconductor device.

15. The semiconductor device of claim 14, further comprising a through electrode, wherein the through electrode electrically connects the semiconductor device layer to the electrical patterning layer.

16. The semiconductor device of claim 15, wherein a footprint of the first surface of the semiconductor device has an area greater than that of the second surface.

* * * * *